(12) United States Patent
Choi

(10) Patent No.: US 9,208,834 B2
(45) Date of Patent: Dec. 8, 2015

(54) LATCH CIRCUIT, NONVOLATILE MEMORY DEVICE AND INTEGRATED CIRCUIT

(71) Applicant: SK hynix Inc., Gyeonggi-do (KR)

(72) Inventor: Sung-Dae Choi, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 153 days.

(21) Appl. No.: 13/866,691

(22) Filed: Apr. 19, 2013

(65) Prior Publication Data

US 2013/0279273 A1 Oct. 24, 2013

(30) Foreign Application Priority Data

Apr. 23, 2012 (KR) .................. 10-2012-0042173

(51) Int. Cl.
| | |
|---|---|
| *G11C 7/10* | (2006.01) |
| *G11C 16/30* | (2006.01) |
| *G11C 16/32* | (2006.01) |
| *H03K 3/012* | (2006.01) |
| *H03K 3/356* | (2006.01) |

(52) U.S. Cl.
CPC *G11C 7/10* (2013.01); *G11C 16/30* (2013.01); *G11C 16/32* (2013.01); *H03K 3/012* (2013.01); *H03K 3/356* (2013.01); *G11C 2216/14* (2013.01)

(58) Field of Classification Search
CPC ......... G11C 7/106; G11C 7/1087; G11C 7/12
USPC .............. 365/189.05, 189.15, 189.16, 230.06
See application file for complete search history.

(56) References Cited

U.S. PATENT DOCUMENTS

| | | | | |
|---|---|---|---|---|
| 2006/0034142 | A1* | 2/2006 | Ooishi et al. ............. | 365/230.06 |
| 2007/0297228 | A1* | 12/2007 | Song et al. ............... | 365/185.08 |
| 2009/0295770 | A1 | 12/2009 | Woo et al. | |
| 2012/0081979 | A1* | 4/2012 | An ........................... | 365/189.16 |
| 2012/0140572 | A1* | 6/2012 | Kim et al. ................ | 365/189.05 |

FOREIGN PATENT DOCUMENTS

KR 100965773 6/2010

* cited by examiner

*Primary Examiner* — Richard Elms
*Assistant Examiner* — Ajay Ojha
(74) *Attorney, Agent, or Firm* — IP & T Group LLP

(57) ABSTRACT

A latch circuit may include a plurality of latches configured to operate in response to power supplied to a pull-up power supply node and a pull-down power supply node, a delay unit configured to generate a 1st delayed reset signal and a 2nd delayed reset signal by delaying a 1st reset signal and a 2nd reset signal, a power supply unit configured to supply identical power to the pull-up power supply node and the pull-down power supply node in response to the activated 1st reset signal or the activated 2nd reset signal, a 1st reset unit configured to reset a plurality of latches to a 1st level in response to the 1st delayed reset signal and a 2nd reset unit configured to reset the plurality of latches to a 2nd level in response to the 2nd delayed reset signal.

20 Claims, 10 Drawing Sheets

LATCH CIRCUIT, NONVOLATILE MEMORY DEVICE AND INTEGRATED CIRCUIT

CROSS-REFERENCE TO RELATED APPLICATIONS

The present application claims priority of Korean Patent Application No. 10-2012-0042173, filed on Apr. 23, 2012, which is incorporated herein by reference in its entirety.

BACKGROUND

1. Field

Exemplary embodiments of the present invention relate to a latch circuit and a nonvolatile memory device including the latch circuit.

2. Description of the Related Art

An integrated circuit chip, such as a memory device, includes a latch circuit in order to maintain data for some time period.

FIG. 1 is a diagram showing a conventional latch circuit.

The latch circuit includes N latches 10_1~10_N and a reset unit 20.

Each of the latches 10_1~10_N latches data in response to a core voltage VCC supplied to a pull-up power supply node PUSPL_ND and a ground voltage VSS supplied to a pull-down power supply node PDSPL_ND.

The reset unit 20 resets the latches 10_1~10_N to a low level when a 1st reset signal RESET is activated and resets the latches 10_1~10_N to a high level when a 2nd reset signal SET is activated.

For the reset of the latches 10_1~10_N to a low level, the 1st reset signal RESET is activated. The 1st transistors 21_1~21_N of the reset unit 20 are turned on in response to the activated 1st reset signal RESET, and thus the 1st latch node Q of each of the latches 10_1~10_N is grounded (VSS). Accordingly, the voltage level of the 1st latch node Q is lowered because of discharge of the 1st latch node Q. The voltage of each of the 2nd latch nodes Q_N of the latches 10_1~10_N becomes a level of the core voltage VCC, and the voltage of the 1st latch node Q becomes a level of the ground voltage VSS. When the 1st reset signal RESET becomes a low level and thus the 1st transistors 21_1~21_N are turned off, the 1st latch nodes Q of the latches 10_1~10_N maintain voltage of a low level by the voltage of the pull-down power supply node PDSPL_ND and the 2nd latch nodes Q_N maintain voltage of a high level by the voltage of the pull-up power supply node PUSPL_ND.

For the reset of the latches 10_1~10_N to a high level, the 2nd reset signal SET is activated. In this case, the operations of the latches 10_1~10_N are opposite to those when the latches 10_1~10_N are reset to a low level. The 2nd transistors 22_1~22_N of the reset unit 20 are turned on in response to the activated 2nd reset signal SET, and thus the 2nd latch node Q_N of each of the latches 10_1~10_N is grounded (VSS). Accordingly, the voltage level of the 2nd latch node Q_N is lowered because discharge of the 2nd latch node Q_N. The voltage of the 1st latch node Q becomes a level of the core voltage VCC, and the voltage of the 2nd latch node Q_N becomes a level of the ground voltage VSS. When the 2nd reset signal SET becomes a low level and thus the 2nd transistors 22_1~22_N are turned off, the voltage of each of the 1st latch nodes Q of the latches 10_1~10_N maintains a high level by the voltage of the pull-up power supply node PUSPL_ND, and the voltage of each of the 2nd latch nodes Q_N of the latches 10_1~10_N maintains a low level by the voltage of the pull-down power supply node PDSPL_ND.

If a value stored in each of the latches 10_1~10_N is different from a value to be reset, however, a lot of a current is consumed in order to reset the latches 10_1~10_N. In particular, in a system including the latch circuit, an excessive peak current is induced due to the reset of latches.

SUMMARY

Exemplary embodiments of the present invention are directed to a latch circuit for resetting latches with a minimum current and a minimum reset time.

In accordance with an embodiment of the present invention, a latch circuit may include a latch configured to operate in response to power supplied to a pull-up power supply node and a pull-down power supply node; a delay unit configured to generate a delayed reset signal by delaying a reset signal; a power supply unit configured to supply identical power to the pull-up power supply node and the pull-down power supply node in response to the reset signal; and a reset unit configured to reset the latch to a 1st level in response to the delayed reset signal.

In accordance with another embodiment of the present invention, a latch circuit may include a plurality of latches configured to operate in response to power supplied to a pull-up power supply node and a pull-down power supply node; a delay unit configured to generate a delayed reset signal by delaying a reset signal; a power supply unit configured to supply identical power to the pull-up power supply node and the pull-down power supply node in response to the reset signal; and a reset unit configured to reset a plurality of latches to a 1st level in response to the delayed reset signal.

In accordance with another embodiment of the present invention, a latch circuit may include a latch configured to operate in response to power supplied to a pull-up power supply node and a pull-down power supply node; a delay unit configured to generate a 1st delayed reset signal and a 2nd delayed reset signal by delaying a 1st reset signal and a 2nd reset signal; a power supply unit configured to supply identical power to the pull-up power supply node and the pull-down power supply node in response to the activated 1st reset signal or the activated 2nd reset signal; a 1st reset unit configured to reset a latch included in the latch circuit to a 1st level in response to the st delayed reset signal; and a 2nd reset unit configured to reset the to a 2nd level in response to the 2nd delayed reset signal.

In accordance with another embodiment of the present invention, a latch circuit may include a plurality of latches configured to operate in response to power supplied to a pull-up power supply node and a pull-down power supply node; a delay unit configured to generate a 1st delayed reset signal and a 2nd delayed reset signal by delaying a 1st reset signal and a 2nd reset signal; a power supply unit configured to supply identical power to the pull-up power supply node and the pull-down power supply node in response to the activated 1st reset signal or the activated 2nd reset signal; a 1st reset unit configured to reset a plurality of latches to a 1st level in response to the 1st delayed reset signal; and a 2nd reset unit configured to reset the plurality of latches to a 2nd level in response to the 2nd delayed reset signal.

In accordance with yet another embodiment of the present invention, a nonvolatile memory device may include a memory cell; a page buffer configured to access data stored in the memory cell and comprising one or more latches operating in response to power supplied to, a pull-up power supply node and a pull-down power supply node; a delay unit configured to generate a delayed reset signal by delaying a reset signal; a power supply unit configured to supply identical power to the pull-up power supply node and the pull-down power supply node in response to the reset signal; and a reset unit configured to reset the one or more latches to a 1st level in response to the delayed reset signal.

In accordance with yet another embodiment of the present invention, a nonvolatile memory device may include a plurality of memory cells; a plurality of page buffers configured to access data stored in the respective memory cells and each comprising one or more latches operating in response to power supplied to a pull-up power supply node and a pull-down power supply node; a delay unit configured to generate a 1st delayed reset signal and a 2nd delayed reset signal by delaying a 1st reset signal and a 2nd reset signal; a power supply unit configured to supply identical power to the pull-up power supply node and the pull-down power supply node in response to the activated 1st reset signal or the activated 2nd reset signal; and a reset unit configured to reset the one or more latches to a 1st level in response to the 1st delayed reset signal, and reset the one or more latches to a 2nd level in response to the 2nd delayed reset signal.

In accordance with yet another embodiment of the present invention, a integrated circuit may include a plurality of memory cells, a plurality of access units configured to access data stored in the respective memory cells and each comprising one or more latches operating in response to power supplied to a pull-up power supply node and a pull-down power supply node, a delay unit configured to generate a 1st delayed reset signal and a 2nd delayed reset signal by delaying a 1st reset signal and a 2nd reset signal a power supply unit configured to supply identical power to the pull-up power supply node and the pull-down power supply node in response to the activated 1st reset signal or the activated 2nd reset signal and a reset unit configured to reset the one or more latches to a 1st level in response to the 1st delayed reset signal, and reset the one or more latches to a 2nd level in response to the 2nd delayed reset signal.

DETAILED DESCRIPTION

Figure 1:
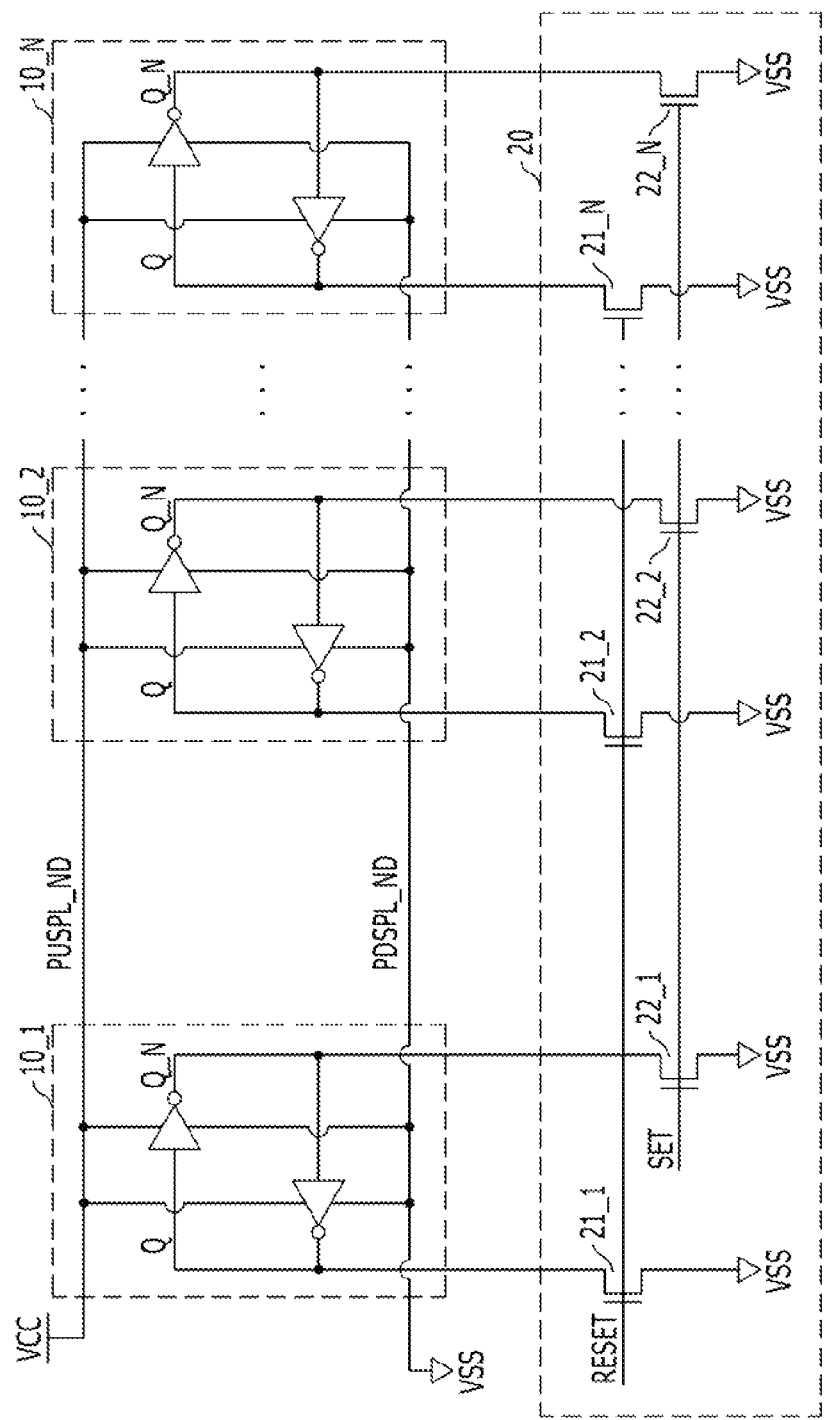
FIG. 1 is a diagram illustrating a conventional latch circuit.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

The latch circuit in accordance with the present invention is summarized as follows. When one or more latches are to be reset to the 1st level for example, the one or more latches are firstly precharged with voltage having a level between the 1st level and the 2nd level for latched data (for example, voltage of a middle level between the 1st and 2nd levels) and then reset to the 1st level. That is, the latch circuit in accordance with the present invention resets the one or more latches gradually (firstly precharging to a level between the 1st and 2nd levels, and then full-charging to the 1st level). As a result, a peak current may be further lowered as compared with a conventional latch circuit configured to reset one or more latches at once from the 2nd level to the 1st level.

Figure 2:
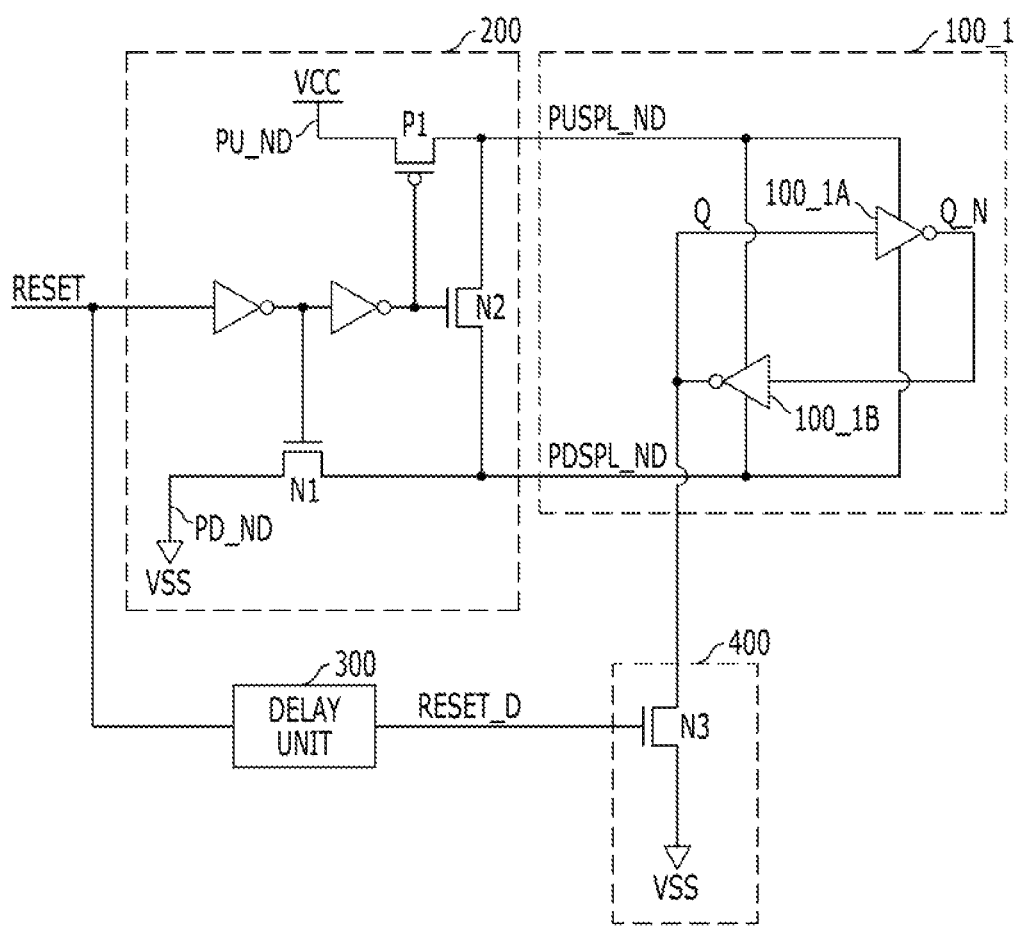
FIG. 2 is a diagram illustrating a latch circuit in accordance with a 1st embodiment of the present invention.

FIG. 2 is a diagram showing a latch circuit in accordance with a 1st embodiment of the present invention.

The latch circuit may include a latch 100_1, a power supply unit 200, a delay unit 300, and a reset unit 400.

The latch 100_1 latches data in response to voltage sources supplied to the pull-up and pull-down power supply nodes PUSPL_ND and PDSPL_ND, 1st and 2nd inverters 100_1A and 100_1B respectively inverts the voltages of 1st and 2nd latch nodes Q and Q_N with the power supplied to the pull-up and pull-down power supply nodes PUSPL_ND and PDSPL_ND.

The power supply unit 200 supplies power to the pull-up and pull-down power supply nodes PUSPL_ND and PDSPL_ND in response to a reset signal RESET. When the reset signal RESET is deactivated, the power supply unit 200 supplies a pull-up voltage VCC to the pull-up power supply node PUSPL_ND and a pull-down voltage VSS to the pull-down power supply node PDSPL_ND. When the reset signal RESET is activated, the power supply unit 200 supplies the same power (for example, voltage between the voltages VCC and VSS) to the pull-up and pull-down power supply nodes PUSPL_ND and PDSPL_ND. With the reset signal RESET activated, the power supply unit 200 does not supply the voltages VCC and VSS to the pull-up and pull-down power supply nodes PUSPL_ND and PDSPL_ND, but couples and supplies the pull-up and pull-down power supply nodes PUSPL_ND and PDSPL_ND with voltage of a middle level between the voltages VCC and VSS. The power supply unit 200 includes a pull-up power node PU_ND configured to supply a pull-up voltage, and a pull-down power node PD_ND configured to supply a pull-down voltage. A 1st switch P1 couples the pull-up power node PU_ND and the pull-up power supply node PUSPL_ND in response to the deactivated reset signal RESET. A 2nd switch N1 couples the pull-down power node PD_ND and the pull-down power supply node PDSPL_ND in response to the deactivated reset signal RESET. A 3rd switch N2 couples the pull-up and the pull-down power supply nodes PUSPL_ND and PDSPL_ND in response to the activated reset signal RESET.

The delay unit 300 generates a delayed reset signal RESET_D by delaying the reset signal RESET so that the activation periods of the delayed reset signal RESET_D and the reset signal RESET partially overlaps to each other, preferably to a minimum.

The reset unit 400 resets the latch 100_1 to a 1st level in response to the delayed reset signal RESET_D. FIG. 2 illustrates an example in which the reset unit 400 resets the latch 100_1 to a low level when the delayed reset signal RESET_D is activated. The reset unit 400 is turned on in response to the delayed reset signal RESET_D and includes a transistor N3 connected to the ground (VSS) and the 1st latch node Q.

Figure 3:
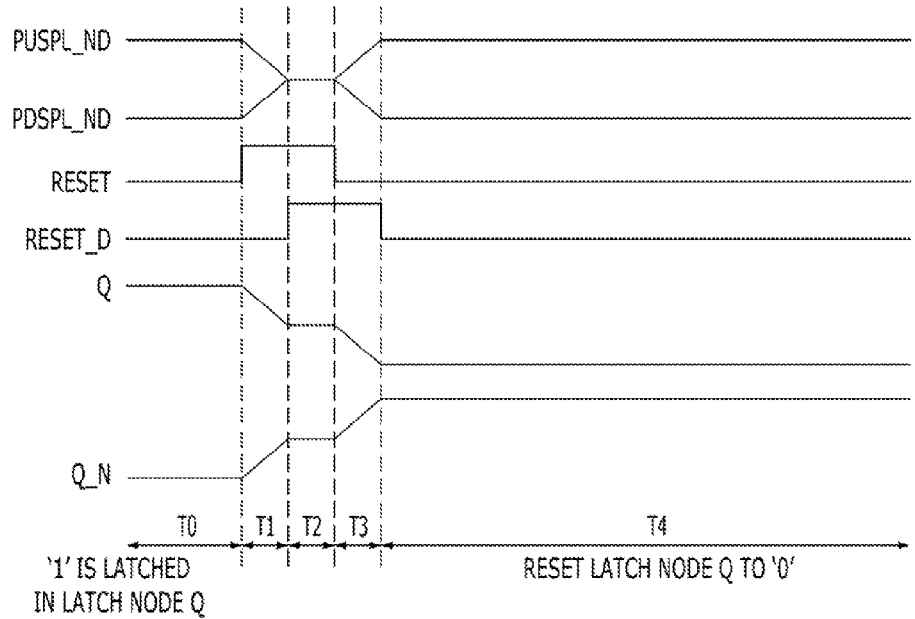
FIG. 3 is a timing diagram illustrating the reset operation of the latch circuit shown in FIG. 2.

FIG. 3 is a timing diagram showing the reset operation of the latch circuit shown in FIG. 2.

Data of a high level may be latched in the 1st latch node Q of the latch 100_1 prior to the reset operation of the latch circuit. Since the reset signal RESET is a low level during a period T0, the 1st and the 2nd switches P1 and N1 are turned on and the 3rd switch N2 is turned off. Accordingly, the pull-up and pull-down power supply nodes PUSPL_ND and PDSPL_ND are not coupled to each other, but the pull-up power node PU_ND and the pull-up power supply node PUSPL_ND are coupled to each other, so the voltage VCC is supplied to the pull-up power supply node PUSPL_ND. Also the pull-down power node PD_ND and the pull-down power supply node PDSPL_ND are coupled to each other so the voltage VSS is supplied to the pull-down power supply node PDSPL_ND. Accordingly, the voltage of the pull-up power supply node PUSPL_ND becomes a level of the voltage VCC, and the voltage of the pull-down power supply node PDSPL_ND becomes a level of the voltage VSS. The voltage of the 1st latch node Q of the latch 100_1 becomes a level of the voltage VCC by the voltage of the pull-up power supply node PUSPL_ND, and the voltage of the 2nd latch node Q_N becomes a level of the voltage VSS by the voltage of the pull-down power supply node PDSPL_ND.

In a period T1, the reset signal RESET is activated. In response to the activated reset signal RESET, the 1st and the 2nd switches P1 and N1 are turned off and the 3rd switch N2 is turned on. Accordingly, the coupling of the pull-up power node PU_ND and the pull-up power supply node PUSPL_ND is no longer maintained, the coupling of the pull-down power node PD_ND and the pull-down power supply node PDSPL_ND is no longer maintained, and the pull-up and pull-down power supply nodes PUSPL_ND and PDSPL_ND are coupled. As a result, the voltage of the pull-up and pull-down power supply nodes PUSPL_ND and PDSPL_ND respectively drop and rise to the middle level between the voltages VCC and VSS. As a result, the voltage of the 1st and 2nd latch nodes Q and Q_N respectively drop and rise to levels between the voltages VCC and VSS by the voltage of the pull-up and pull-down power supply nodes PUSPL_ND and PDSPL_ND.

The delay unit 300 generates the delayed reset signal RESET_D whose activation period is overlapped with the activation period of the reset signal RESET for a period T2, by delaying the reset signal RESET. The transistor N3 of the reset unit 400 is turned on in response to the reset signal RESET_D in the period T2, and thus the 1st latch node Q is grounded (VSS). Each of the 1st and 2nd latch nodes Q and Q_N maintains the same voltage of certain levels between the voltages VCC and VSS.

In a period T3, the reset signal RESET is deactivated. In response to the deactivated reset signal RESET, the 1st and the 2nd switches P1 and N1 are turned on and the 3rd switch N2 is turned off. Thus, the coupling of the pull-up and pull-down power supply nodes PUSPL_ND and PDSPL_ND is no longer maintained and the pull-up power node PU_ND and the pull-up power supply node PUSPL_ND are coupled. Accordingly, the voltage VCC is supplied to the pull-up power supply node PUSPL_ND. The pull-down power node PD_ND and the pull-down power supply node PDSPL_ND are coupled to each other, so the voltage VSS is supplied to the pull-down power supply node PDSPL_ND. As a result, the voltage of the pull-up power supply node PUSPL_ND rises to a level of the voltage VCC, and the voltage of the pull-down power supply node PDSPL_ND drops to the level of the voltage VSS. The 1st latch node Q is being grounded (VSS) by the transistor N3 that is turned on in response to the delayed reset signal RESET_D. As a result, the voltage of the 1st latch node Q drops to the level of the voltage VSS by the voltage of the pull-down power supply node PDSPL_ND, and the voltage of the 2nd latch node Q_N rises to a level of the voltage VCC by the voltage of the pull-up power supply node PUSPL_ND.

In a period T4, the delayed reset signal RESET_D is deactivated, and thus the transistor N3 of the reset unit 400 is turned off. Thus, the coupling of the 1st latch node Q and the ground node to is no longer maintained. As a result, in the period T4, the voltage of the 1st latch node Q maintains the level of the voltage VSS by the pull-down power supply node PDSPL_ND, and the voltage of the 2nd latch node Q_N maintains the level of the voltage VCC by the pull-up power supply node PUSPL_ND.

Figure 4:
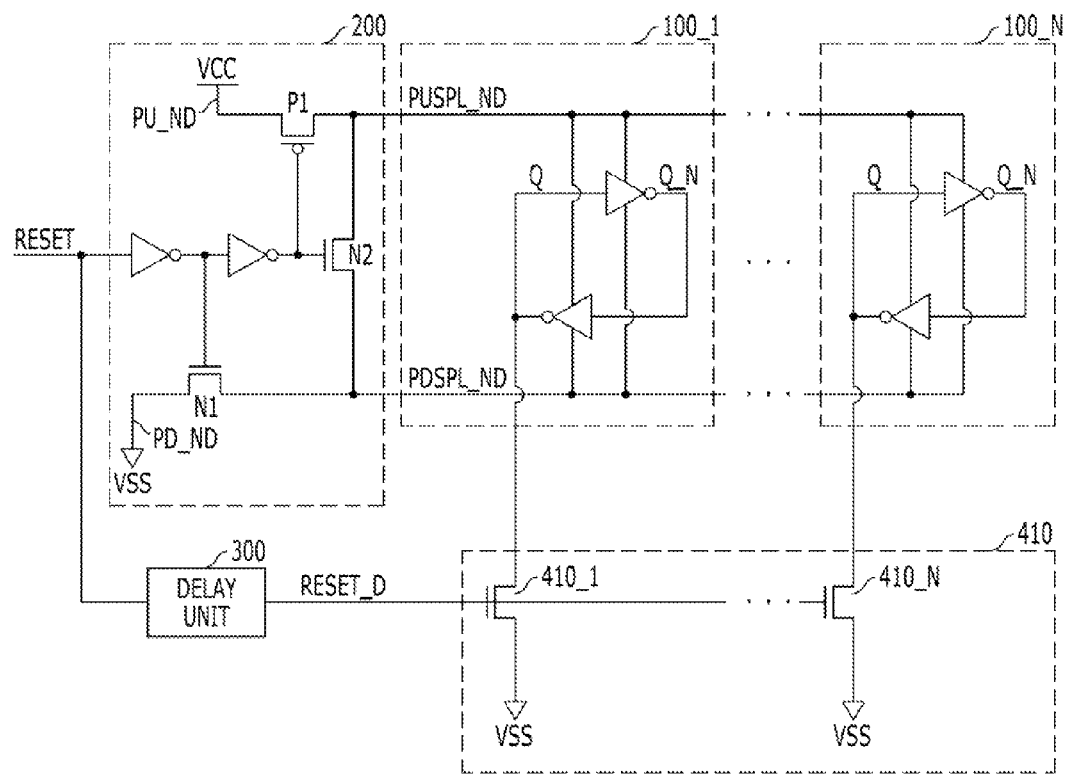
FIG. 4 is a diagram illustrating a latch circuit in accordance with a 2nd embodiment of the present invention.

The latch circuit in accordance with the present invention include a plurality of latches 100_1~100_N as in an embodiment of FIG. 4. That is, the latch circuit may include the latches 100_1~100_N a power supply unit 200, a delay unit 300 and a reset unit 410.

The power supply unit 200 and the delay unit 300 have constructions and operating principles same as those of the power supply unit 200 and the delay unit 300, respectively, described with reference to FIG. 2.

Each of the latches 100_1~100_N latches data in response to power supplied to the pull-up and pull-down power supply nodes PUSPL_ND and PDSPL_ND. Each of the latches 100_1~100_N has a construction and operating principle same as the latch 100_1 described with reference to FIG. 2.

The reset unit 410 resets the latches 100_1~100_N to a 1st level in response to a delayed reset signal RESET_D. FIG. 4 illustrates an example in which the reset unit 410 resets the latches 100_1~100_N to a low level when the delayed reset signal RESET_D is activated. The reset unit 410 includes N transistors 410_1~410_N corresponding to the respective latches 100_1~100_N. Each of the N transistors 410_1~410_N is turned on when the delayed reset signal RESET_D is activated, and is coupled to the ground and the 1st latch nodes Q of the corresponding one of the latches 100_1~100_N.

The reset operation of the latch circuit of FIG. 4 is same as the reset operation of the latch circuit of FIG. 2 except that all the latches 100_1~100_N are reset at once.

Figure 5:
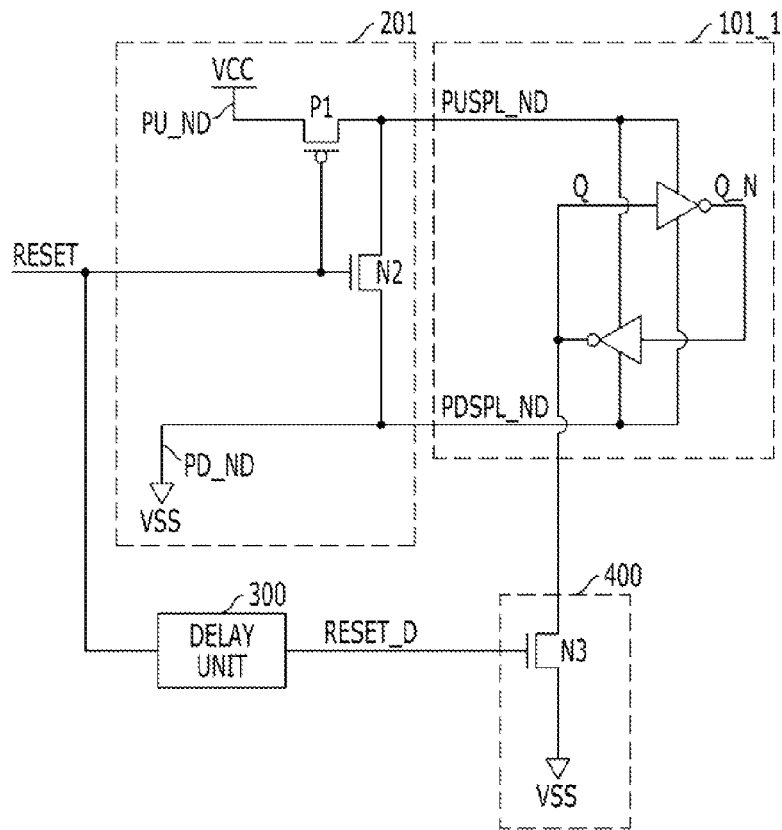
FIG. 5 is a diagram illustrating a latch circuit in accordance with a 3rd embodiment of the present invention.

FIG. 5 is a diagram showing a latch circuit in accordance with a 3rd embodiment of the present invention.

The latch circuit of FIG. 5 differs from the latch circuit of FIG. 2 in the type of power supplied to the pull-up and pull-down power supply nodes PUSPL_ND and PDSPL_ND in response to the activated reset signal RESET.

The latch circuit of FIG. 5 may include a latch 101_1, a power supply unit 201, a delay unit 300, and a reset unit 400.

The latch 101_1 has a construction and operating principle same as that of the latch 100_1 described with reference to FIG. 2.

The delay unit 300 and the reset unit 400 have constructions and operating principles same as those of the delay unit 300 and the reset unit 400, respectively, described with reference to FIG. 2.

The power supply unit 201 supplies the same power to the pull-up and pull-down power supply nodes PUSPL_ND and PDSPL_ND in response to a reset signal RESET. The power supply unit 201 supplies a pull-up voltage VCC to the pull-up power supply node PUSPL_ND and a pull-down voltage VSS to the pull-down power supply node PDSPL_ND in response to the deactivated reset signal RESET. The power supply unit 201 supplies the voltage VSS to the pull-up and pull-down power supply nodes PUSPL_ND and PDSPL_ND in response to the activated reset signal RESET. In the power supply unit 201, a pull-up power node PU_ND supplies a pull-up voltage. A pull-down power node PD_ND is coupled and supplies a pull-down voltage to the pull-down power supply node PDSPL_ND regardless of the reset signal RESET. A 1st switch P1 couples the pull-up power node PU_ND and the pull-up power supply node PUSPL_ND in response to the deactivated reset signal RESET, and a 3rd switch N2 couples the pull-up and the pull-down power supply nodes PUSPL_ND and PDSPL_ND in response to the activated reset signal RESET.

Figure 6:
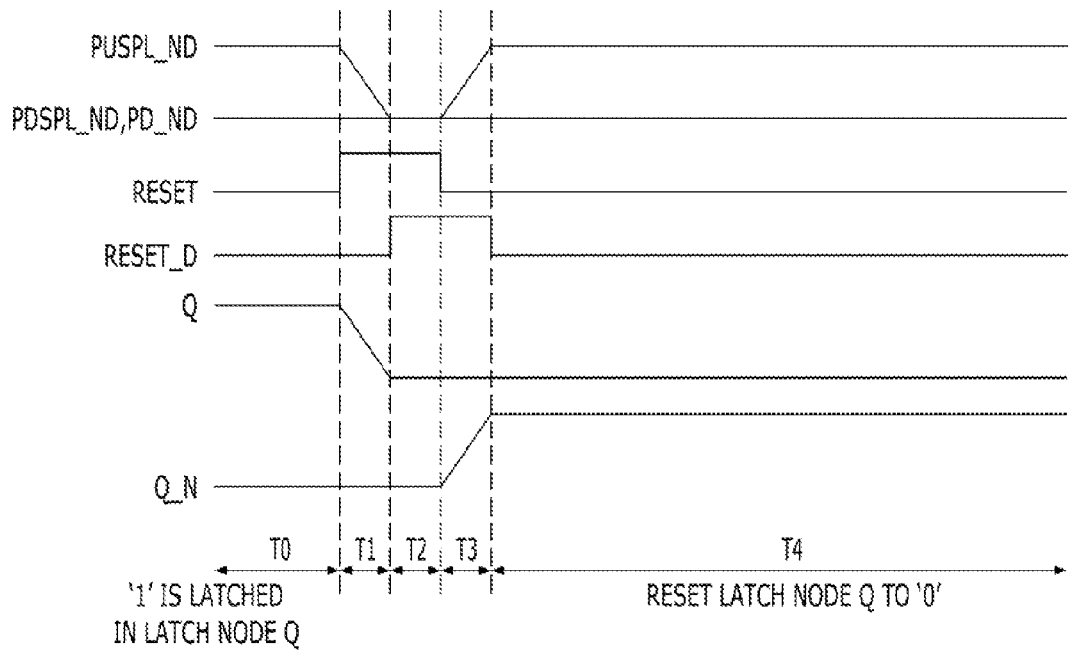
FIG. 6 is a timing diagram illustrating the reset operation of the latch circuit shown in FIG. 5.

FIG. 6 is a timing diagram showing the reset operation of the latch circuit shown in FIG. 5.

Data of a high level is latched the 1st latch Q prior to the reset operation of the latch circuit. Since the reset signal RESET is in a low level during a period T0, the 1st switch P1 is turned on and thus the pull-up power node PU_ND and the pull-up power supply node PUSPL_ND are coupled to each other, so the voltage VCC is supplied to the pull-up power supply node PUSPL_ND. Since the pull-down power supply node PDSPL_ND is coupled to the pull-down power node PD_ND regardless of the reset signal RESET, the voltage VSS is supplied to the pull-down power supply node PDSPL_ND. Since the 3rd switch N2 is turned off in response to the deactivated reset signal RESET, the pull-up and pull-down power supply nodes PUSPL_ND and PDSPL_ND are not coupled. Accordingly, the voltage of the pull-up power supply node PUSPL_ND becomes a level of the voltage VCC, and the voltage of the pull-down power supply node PDSPL_ND becomes a level of the voltage VSS. The voltage of the 1st latch Q becomes a level of the voltage VCC by the voltage of the pull-up power supply node PUSPL_ND, and the voltage of the 2nd latch node Q_N of the latch 101_1 becomes a level of the voltage VSS by the voltage of the pull-down power supply node PDSPL_ND.

In a period T1, the reset signal RESET is activated. The 1st switch P1 is turned off in response to the activated reset signal RESET, and thus the coupling of the pull-up power node PU_ND and the pull-up power supply node PUSPL_ND is no longer maintained. Thus, the voltage VCC is no longer supplied to the pull-up power supply node PUSPL_ND. The voltage VSS is supplied to the pull-down power supply node PDSPL_ND because the pull-down power node PD_ND and the pull-down power supply node PDSPL_ND are coupled regardless of the reset signal RESET. Accordingly, the voltage of the pull-down power supply node PDSPL_ND maintains the level of the voltage VSS. The 3rd switch N2 is turned on in response to the activated reset signal RESET and thus the pull-up and pull-down power supply nodes PUSPL_ND and PDSPL_ND are coupled to each other, so the voltage of the pull-up power supply node PUSPL_ND drops to the level of the voltage VSS. As a result, the voltage of the 1st latch Q drops to the level of the voltage VSS by the voltage of the pull-up power supply node PUSPL_ND, and the voltage of the 2nd latch node Q_N maintains the level of the voltage VSS by the voltage of the pull-down power supply node PDSPL_ND.

The delay unit 300 generates a delayed reset signal RESET_D, whose activation period is overlapped with the activation period of the reset signal RESET for a period T2, by delaying the reset signal RESET. The transistor N3 of the reset unit 400 is turned on in response to the reset signal RESET_D in the period T2, and thus the 1st latch node Q is grounded (VSS). The voltage of each of the 1st and 2nd latch nodes Q and Q_N maintains a level of the voltage of the pull-up power supply node PUSPL_ND or the pull-down power supply node PDSPL_ND, that is, a level of the voltage VSS.

In a period T3, the reset signal RESET is deactivated. In response to the deactivated reset signal RESET, the 3rd switch N2 is turned off and thus the coupling of the pull-up and pull-down power supply nodes PUSPL_ND and PDSPL_ND is no longer maintained. The 1st switch P1 is turned on and thus the pull-up power node PU_ND and the pull-up power supply node PUSPL_ND are coupled. Thus, the voltage VCC is supplied to the pull-up power supply node PUSPL_ND. As a result, the voltage of the pull-up power supply node PUSPL_ND rises to a level of the voltage VCC. The voltage of the pull-down power supply node PDSPL_ND coupled to the pull-down power node PD_ND regardless of the reset signal RESET maintains the level of the voltage VSS. The 1st latch node Q is grounded (VSS) by the transistor N3 turned on in response to the delayed reset signal RESET_D. As a result, the voltage of the 1st latch node Q maintains the level of the voltage VSS by the voltage of the pull-down power supply node PDSPL_ND, and the voltage of the 2nd latch node Q_N rises to a level of the voltage VCC by the voltage of the pull-up power supply node PUSPL_ND.

In a period T4, the delayed reset signal RESET_D is deactivated, and thus the transistor N3 of the reset unit 400 is turned off. Thus, the coupling of the 1st latch node Q and the ground node is no longer maintained. As a result, in the period T4, the voltage of the 1st latch node Q maintains the level of the voltage VSS by the voltage of the pull-down power supply node PDSPL_ND, and the voltage of the 2nd latch node Q_N maintains the level of the voltage VCC by the voltage of the pull-up power supply node PUSPL_ND.

Figure 7:
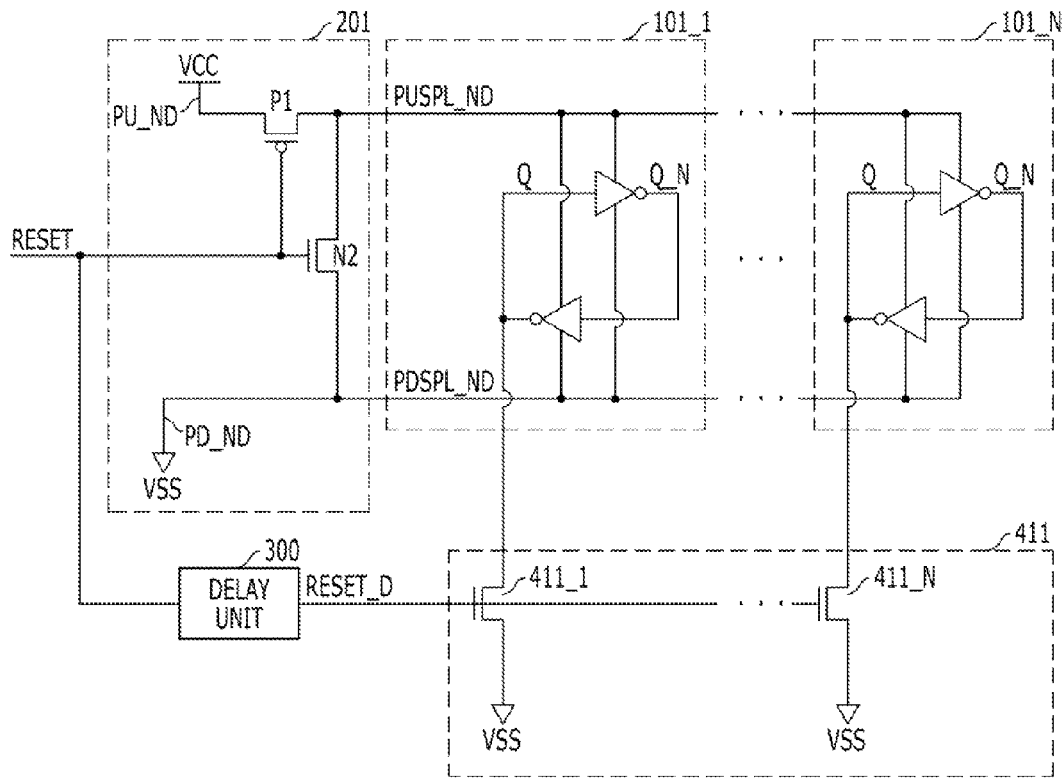
FIG. 7 is a diagram illustrating a latch circuit in accordance with a 4th embodiment of the present invention.

FIG. 7 is a diagram showing a latch circuit in accordance with a 4th embodiment of the present invention.

The latch circuit of FIG. 7 differs from the latch circuit of FIG. 5 in that it includes a plurality of latches 101_1~101_N. That is, the latch circuit of FIG. 7 may include the latches 101_1~101_N, a power supply unit 201, a delay unit 300, and a reset unit 411.

The power supply unit 201 and the delay unit 300 have constructions and operating principles same as those of the power supply unit 201 and the delay unit 300, respectively, described with reference to FIG. 5.

Each of the latches 101_1~101_N latches data in response to power supplied to the pull-up and pull-down power supply nodes PUSPL_ND and PDSPL_ND. Each of the latches 101_1~101_N has a is construction and operating principle same as that of the latch 101_1 described with reference to FIG. 5.

The reset unit 411 resets the latches 101_1~101_N to a 1st level in response to a delayed reset signal RESET_D. FIG. 7 illustrates an example in which the reset unit 411 resets the latches 101_1~101_N to a low level when the delayed reset signal RESET_D is activated. The reset unit 411 include N transistors 411_1~411_N corresponding to the respective latches 101_1~101_N. Each of the transistors 411_1~411_N is turned on when the delayed reset signal RESET_D is activated and is coupled to the ground and the 1st latch node Q of a corresponding latch of the latches 101_1~101_N.

The reset operation of the latch circuit of FIG. 7 is same as the reset operation of the latch circuit of FIG. 5 in that all the latches 101_1~101_N are reset at once.

The latch circuits configured to perform the reset operations using one reset signal RESET have been described so far. Latch circuits configured to perform reset operations using two reset signals RESET and SET are described below.

Figure 8:
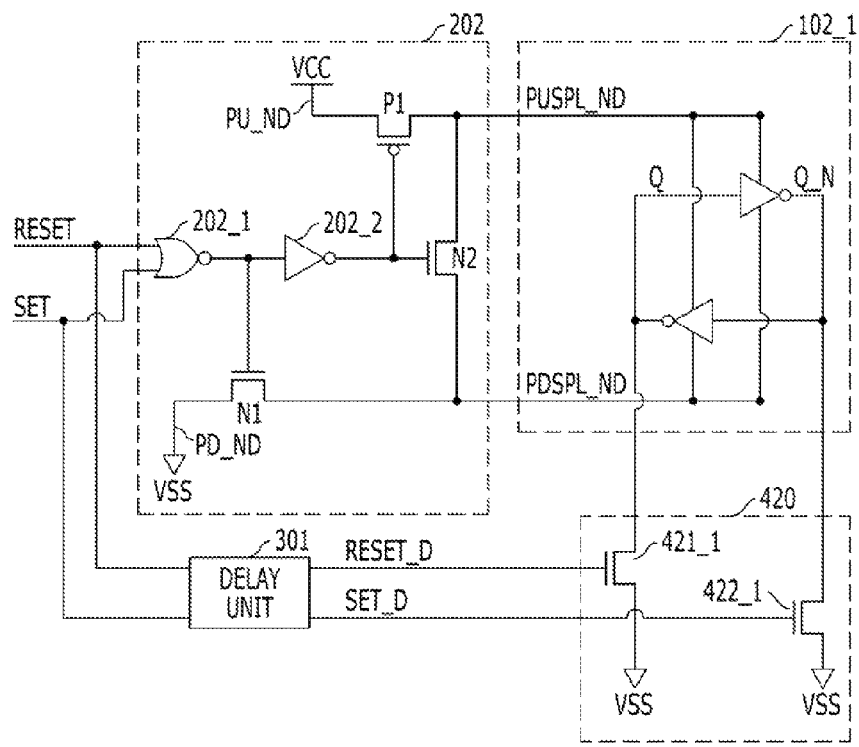
FIG. 8 is a diagram illustrating a latch circuit in accordance with a 5th embodiment of the present invention.

FIG. 8 is a diagram showing a latch circuit in accordance with a 5th embodiment of the present invention.

The latch circuit may include a latch 102_1, a power supply unit 202, a delay unit 301, and a reset unit 420.

The latch 102_1 latches data in response to power supplied to the pull-up and pull-down power supply nodes PUSPL_ND and PDSPL_ND. The latch 102_1 has a construction and operating principle same as that of the latch 100_1 described with reference to FIG. 2.

The power supply unit 202 supplies the same power to the pull-up and pull-down power supply nodes PUSPL_ND and PDSPL_ND when a 1st reset signal RESET or a 2nd reset signal SET is activated. The power supply unit 202 supplies a pull-up voltage VCC to the pull-up power supply node PUSPL_ND and a pull-down voltage VSS to the pull-down power supply node PDSPL_ND when both the 1st and 2nd reset signals RESET and SET are deactivated. The power supply unit 202 supplies the same power (for example, voltage having a middle level between the voltages VCC and VSS) to the pull-up and pull-down power supply nodes PUSPL_ND and PDSPL_ND when one of the 1st and 2nd reset signals RESET and SET is activated.

When one of the 1st and 2nd reset signals RESET and SET is activated, the power supply unit 202 does not supply the voltages VCC and VSS to the pull-up and pull-down power supply nodes PUSPL_ND and PDSPL_ND, but couples and supplies voltage of the middle level between the voltages VCC and VSS to the pull-up and pull-down power supply nodes PUSPL_ND and PDSPL_ND. For example, the power supply unit 202 includes a pull-up power node PU_ND supplying a pull-up voltage, a pull-down power node PD_ND supplying a pull-down voltage, a 1st switch P1 coupling the pull-up power node PU_ND and the pull-up power supply node PUSPL_ND when both the 1st and 2nd reset signals RESET and SET are deactivated, a 2nd switch N1 coupling the pull-down power node PD_ND and the pull-down power supply node PDSPL_ND when both the 1st and 2nd reset signals RESET and SET are deactivated, and a 3rd switch N2 coupling the pull-up and the pull-down power supply nodes PUSPL_ND and PDSPL_ND when one of the 1st and 2nd reset signals RESET and SET is activated.

The delay unit 301 generates a 1st and 2nd delayed reset signals RESET_D and SET_D by delaying the 1st and 2nd reset signals RESET and SET. The delay unit 301 generates the 1st delayed reset signal RESET_D whose activation period is partially overlapped with the activation period of the 1st reset signal RESET, preferably to a minimum. The delay unit 301 also generates the 2nd delayed reset signal SET_D whose activation period is partially overlapped with the activation period of the 2nd reset signal SET, preferably to a minimum.

The reset unit 420 resets the latch 102_1 to a 1st level in response to the 1st delayed reset signal RESET_D and resets the latch 102_1 to a 2nd level in response to the 2nd delayed reset signal SET_D. FIG. 8 illustrates an example in which the reset unit 420 is designed to reset the latch 102_1 to a low level when the 1st delayed reset signal RESET_D is activated and to reset the latch 102_1 to a high level when the 2nd delayed reset signal SET_D is activated. The reset unit 420 includes 1st and 2nd transistors 421_1 and 422_1. The 1st transistor 421_1 is turned on in response to the 1st delayed reset signal RESET_D and coupled to the ground and the 1st latch node Q. The 2nd transistor 422_1 is turned on in response to the 2nd delayed reset signal SET_D and coupled to the ground node (VSS) and the 2nd latch node Q_N.

Figure 9:
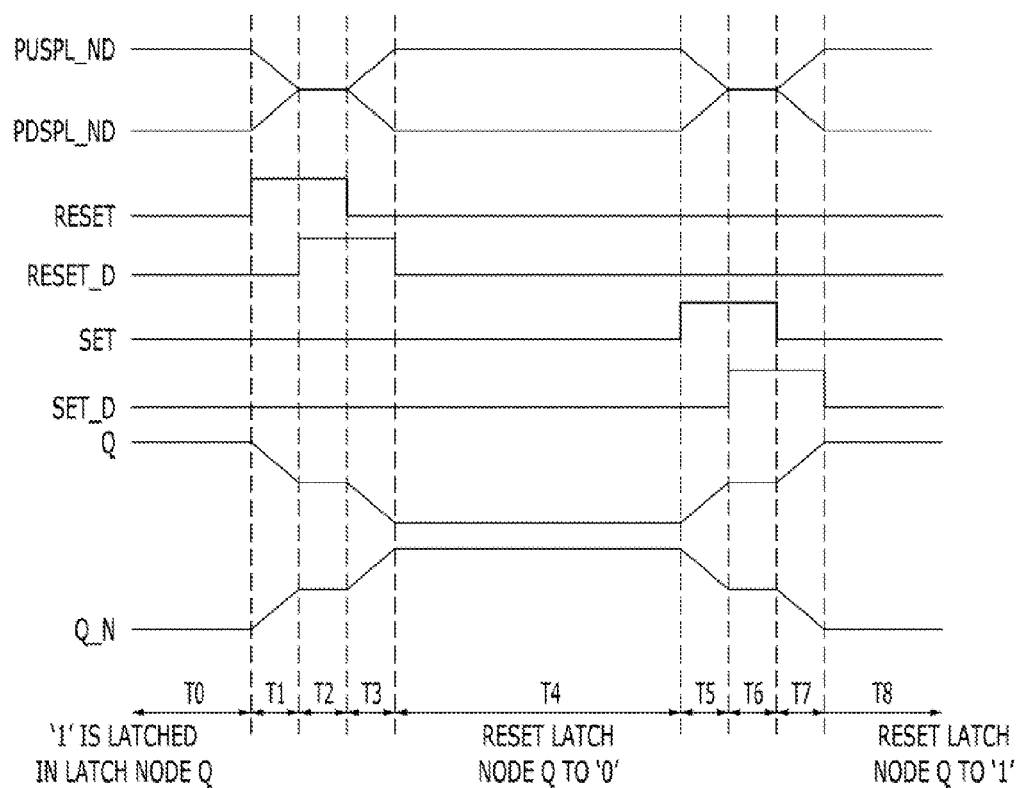
FIG. 9 is a timing diagram illustrating the reset operation of the latch circuit shown in FIG. 8.

FIG. 9 is a timing diagram showing the reset operation of the latch circuit shown in FIG. 8

Operation of Resetting the Latch 102_1 to a Low Level in Response to the 1st Delayed Reset Signal RESET_D (Periods T0~T4)

The operation of resetting the latch 102_1 to a low level in response to the 1st delayed reset signal RESET_D is same as the reset operation of the latch 100_1 described with reference to FIG. 3. Data of a high level may be latched in the 1st latch node Q prior to the reset operation of the latch circuit. During a period T0, the 1st and the 2nd switches P1 and N1 are turned on and the 3rd switch N2 is turned off because both the 1st and 2nd reset signals RESET and SET are in a low level. Accordingly, the pull-up and pull-down power supply nodes PUSPL_ND and PDSPL_ND are not coupled to each other, and the pull-up power node PU_ND and the pull-up power supply node PUSPL_ND are coupled to each other, so the voltage VCC is supplied to the pull-up power supply node PUSPL_ND. Since the pull-down power node PD_ND and the pull-down power supply node PDSPL_ND are coupled to each other, the voltage VSS is supplied to the pull-down power supply node PDSPL_ND. As a result, the voltage of the pull-up power supply node PUSPL_ND becomes a level of the voltage VCC, and the voltage of the pull-down power supply node PDSPL_ND becomes a level of the voltage VSS. The voltage of the 1st latch node Q becomes a level of the voltage VCC by the voltage of the pull-up power supply node PUSPL_ND, and the voltage of the 2nd latch node Q_N becomes a level of the voltage VSS by the voltage of the pull-down power supply node PDSPL_ND.

In a period T1, the 1st reset signal RESET is activated. In response to the activated 1st reset signal RESET, the 1st and the 2nd switches P1 and N1 are turned off and the 3rd switch N2 is turned on. Accordingly, the coupling of the pull-up power node PU_ND and the pull-up power supply node PUSPL_ND is no longer maintained, and thus the voltage VCC is no longer supplied to the pull-up power supply node PUSPL_ND. The coupling of the pull-down power node PD_ND and the pull-down power supply node PDSPL_ND is no longer maintained, and thus the voltage VSS is no longer supplied to the pull-down power supply node PDSPL_ND. The pull-up and pull-down power supply nodes PUSPL_ND and PDSPL_ND are coupled to each other by the turned-on 3rd switch N2. As a result, the voltage of the pull-up power supply node PUSPL_ND drops to a middle level between the voltages VCC and VSS, and thus the voltage of the pull-down power supply node PDSPL_ND rises to the middle level between the voltages VCC and VSS. As a result, the voltage of the pull-up and pull-down power supply nodes PUSPL_ND and PDSPL_ND respectively drop and rise to the middle level between the voltages VCC and VSS.

The delay unit 301 generates the 1st delayed reset signal RESET_D, whose activation period is overlapped with the activation period of the 1st reset signal RESET for a period T2, by delaying the 1st reset signal RESET. The 1st transistor 421_1 is turned on in response to the 1st reset signal RESET_D in the period T2, and thus the 1st latch node Q is grounded (VSS). The voltage of each of the 1st latch node Q and the 2nd latch node Q_N maintains a level of the voltage of the pull-up power supply node PUSPL_ND or the pull-down power supply node PDSPL_ND, that is, the levels between the voltages VCC and VSS.

In a period T3, the 1st reset signal RESET is deactivated. Since both the 1st and 2nd reset signals RESET and SET are in a low level, the 1st and the 2nd switches P1 and N1 are turned on and the 3rd switch N2 is turned off. Thus, the coupling of the pull-up and pull-down power supply nodes PUSPL_ND and PDSPL_ND is no longer maintained and the pull-up power node PU_ND and the pull-up power supply node PUSPL_ND are coupled to each other, so the voltage VCC is supplied to the pull-up power supply node PUSPL_ND. The pull-down power node PD_ND and the pull-down power supply node PDSPL_ND are coupled to each other, and thus the voltage VSS is supplied to the pull-down power supply node PDSPL_ND. As a result, the voltage of the pull-up power supply node PUSPL_ND rises to a level of the voltage VCC, and the voltage of the pull-down power supply node PDSPL_ND drops to a level of the voltage VSS. The 1st latch node Q is being grounded (VSS) by the 1st transistor 421_1 turned on in response to the 1st delayed reset signal RESET_D. As a result, the voltage of the 1st latch node Q drops to a level of the voltage VSS by the voltage of the pull-down power supply node PDSPL_ND and the voltage of the 2nd latch node Q_N rises to a level of the voltage VCC by the voltage of the pull-up power supply node PUSPL_ND.

In a period T4, the 1st delayed reset signal RESET_D is deactivated and thus the 1st transistor 421_1 is turned off, thereby breaking the coupling of the 1st latch node Q and the ground node. As a result, in the period T4, the voltage of the 1st latch node Q maintains the level of the voltage VSS by the voltage of the pull-down power supply node PDSPL_ND, and the voltage of the 2nd latch node Q_N maintains the level of the voltage VCC by the voltage of the pull-up power supply node PUSPL_ND.

Operation of Resetting the Latch 102_1 to a High Level in Response to the 2nd Delayed Reset Signal SET_D (Periods T5~T8)

As described above, in the period T4, data of a low level has been latched in the 1st latch node Q.

In a period T5, the 2nd reset signal SET is activated. In response to the activated 2nd reset signal SET, the 1st and the 2nd switches P1 and N1 are turned off and the 3rd switch N2 is turned on. Accordingly, the coupling of the pull-up power node PU_ND and the pull-up power supply node PUSPL_ND is no longer maintained, and thus the voltage VCC is no longer supplied to the pull-up power supply node PUSPL_ND. The coupling of the pull-down power node PD_ND and the pull-down power supply node PDSPL_ND is no longer maintained, and thus the voltage VSS is no longer supplied to the pull-down power supply node PDSPL_ND. The pull-up and pull-down power supply nodes PUSPL_ND and PDSPL_ND are coupled to each other by the turned-on 3rd switch N2. Thus, the voltage of the pull-up power supply node PUSPL_ND drops to the middle level between the voltages VCC and VSS, and the voltage of the pull-down power supply node PDSPL_ND rises to the middle level between the voltages VCC and VSS. As a result, the voltage of the 1st latch node Q rises to the middle level between the voltages VCC and VSS by the voltage of the pull-down power supply node PDSPL_ND, and the voltage of the 2nd latch node Q_N drops to the middle level between the voltages VCC and VSS by the voltage of the pull-up power supply node PUSPL_ND.

The delay unit 301 generates the 2nd delayed reset signal SET_D, whose activation period is overlapped with the activation period of the 2nd reset signal SET during a period T6, by delaying the 2nd reset signal SET. The 2nd transistor 422_1, is turned on in response to the 2nd reset signal SET_D activated and delayed in the period T6, and thus the 2nd latch node Q_N is grounded (VSS). The voltage of each of the 1st latch node Q and the 2nd latch node Q_N maintains the level of the voltage of the pull-up power supply node PUSPL_ND or the pull-down power supply node PDSPL_ND, that is, the middle level between the voltages VCC and VSS.

In a period T7, the 2nd reset signal SET is deactivated. Since both the 1st and 2nd reset signals RESET and SET are in a low level, the 1st and the 2nd switches P1 and N1 are turned on and the 3rd switch N2 is turned off. Thus, the coupling of the pull-up and pull-down power supply nodes PUSPL_ND and PDSPL_ND is no longer maintained and the pull-up power node PU_ND and the pull-up power supply node PUSPL_ND are coupled to each other, so the voltage VCC is supplied to the pull-up power supply node PUSPL_ND. The pull-down power node PD_ND and the pull-down power supply node PDSPL_ND are coupled to each other, and thus the voltage VSS is supplied to the pull-down power supply node PDSPL_ND. Accordingly, the voltage of the pull-up power supply node PUSPL_ND rises to a level of the voltage VCC, and the voltage of the pull-down power supply node PDSPL_ND drops to a level of the voltage VSS. The 2nd latch node Q_N is being grounded (VSS) by the 2nd transistor 422_1 turned on in response to the 2nd delayed reset signal SET_D. As a result, the voltage of the 2nd latch node Q_N drops to a level of the voltage VSS by the voltage of the pull-down power supply node PDSPL_ND, and the voltage of the 1st latch node Q rises to a level of the voltage VCC by the voltage of the pull-up power supply node PUSPL_ND.

In a period T8, the coupling of the 2nd latch node Q_N and the ground node is no longer maintained because the 2nd delayed reset signal SET_D is deactivated and thus the 2nd transistor 422_1 is turned off. As a result, in the period T8, the voltage of the 2nd latch node Q_N maintains the level of the voltage VSS by the voltage of the pull-down power supply node PDSPL_ND, and the voltage of the 1st latch node Q maintains the level of the voltage VCC by the voltage of the pull-up power supply node PUSPL_ND.

Figure 10:
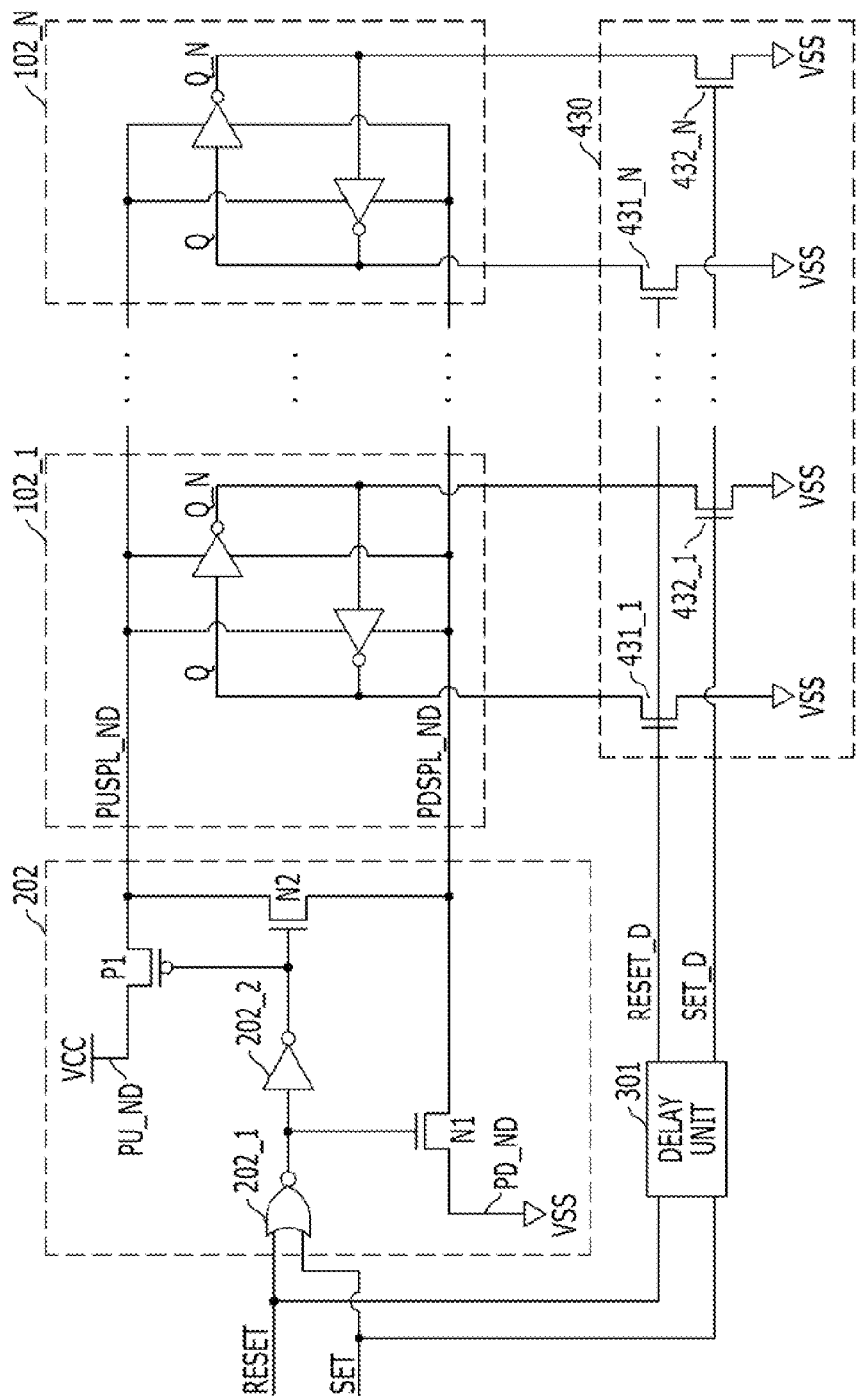
FIG. 10 is a diagram illustrating a latch circuit in accordance with a 6th embodiment of the present invention.

FIG. 10 is a diagram showing a latch circuit in accordance with a 6th embodiment of the present invention.

The latch circuit of FIG. 10 differs from the latch circuit of FIG. 8 in that it includes a plurality of latches 102_1~102_N. That is, the latch circuit of FIG. 10 may include the latches 102_1~102_N, a power supply unit 202, a delay unit 301, and a reset unit 430.

The power supply unit 202 and the delay unit 301 have constructions and operating principle same as those of the power supply unit 202 and the delay unit 301, respectively, described with reference to FIG. 8.

Each of the latches 102_1~102_N latches data in response to power supplied to the pull-up and pull-down power supply nodes PUSPL_ND and PDSPL_ND. Each of the latches 102_1~102_N has a construction and operating principle same as that of the latch 102_1 described with reference to FIG. 8.

The reset unit 430 resets the latches 102_1~102_N to a 1st level in response to a 1st delayed reset signal RESET_D and resets the latches 102_1~102_N to a 2nd level in response to a 2nd delayed reset signal SET_D. FIG. 10 illustrates an example in which the reset unit 430 resets the latches 102_1~102_N to a low level when the 1st delayed reset signal RESET_D is activated and resets the latches 102_1~102_N to a high level when the 2nd delayed reset signal SET_D is activated. The reset unit 430 include 1st transistors 431_1~431_N corresponding to the latches 102_1~102_N, respectively, and 2nd transistors 432_1~432_N corresponding to the latches 102_1~102_N, respectively. Each of the 1st transistors 431_1~431_N is turned on when the 1st delayed reset signal RESET_D is activated and is coupled to the ground and the 1st latch node Q of a corresponding one of the latches 102_1~102_N. Each of the 2nd transistors 432_1~432_N is turned on when the 2nd delayed reset signal SET_D is activated and is coupled to the ground and the 2nd latch node Q_N of a corresponding one of the latches 102_1~102_N.

The reset operation of the latch circuit shown in FIG. 10 is same as the reset operation of the latch circuit shown in FIG. 8 except that all the latches 102_1~102_N are reset at once.

Figure 11:
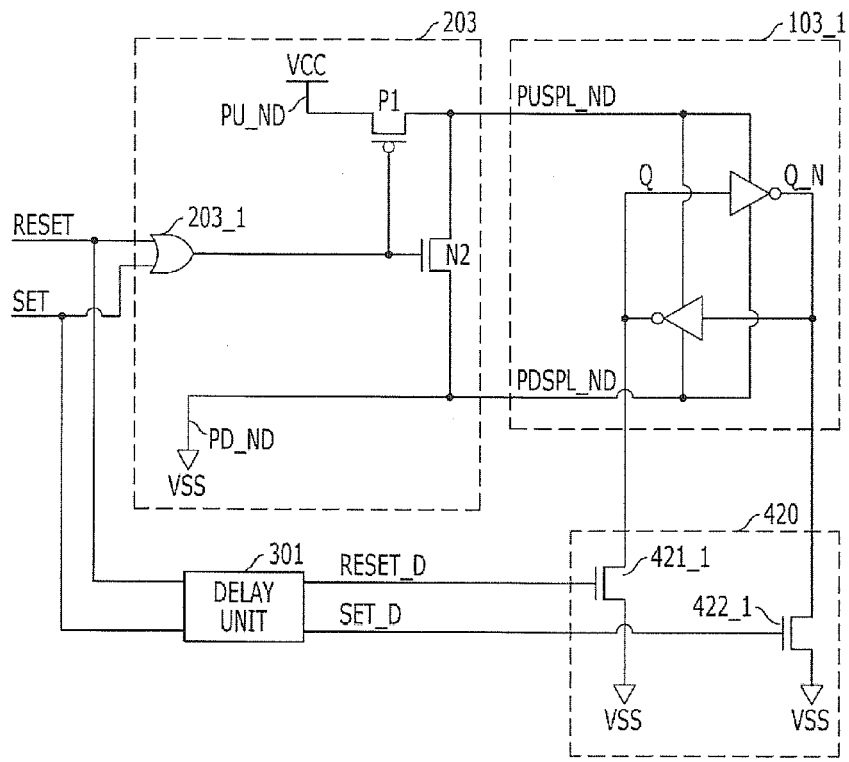
FIG. 11 is a diagram illustrating a latch circuit in accordance with a 7th embodiment of the present invention.

FIG. 11 is a diagram showing a latch circuit in accordance with a 7th embodiment of the present invention.

The latch circuit of FIG. 11 differs from the latch circuit of FIG. 8 in the type of power supplied to the pull-up and pull-down power supply nodes PUSPL_ND and PDSPL_ND when the 1st reset signal RESET or the 2nd reset signal SET is activated.

The latch circuit of FIG. 11 may include a latch 103, a power supply unit 203, a delay unit 301, and a reset unit 420.

The latch 103_1 has a construction and operating principle same as that of the latch 102_1 described with reference to FIG. 8.

The delay unit 301 and the reset unit 420 have constructions and operating principles same as those of the delay unit 301 and the reset unit 420, respectively, described with reference to FIG. 8.

The power supply unit 203 supplies the same power to the pull-up and pull-down power supply nodes PUSPL_ND and PDSPL_ND when a 1st reset signal RESET or a 2nd reset signal SET is activated. The power supply unit 203 supplies a pull-up voltage VCC to the pull-up power supply node PUSPL_ND and a pull-down voltage VSS to the pull-down power supply node PDSPL_ND when both the 1st and 2nd reset signals RESET and SET are deactivated. The power supply unit 203 supplies the voltage VSS to the pull-up and pull-down power supply nodes PUSPL_ND and PDSPL_ND when one of the 1st and 2nd reset signals RESET and SET is activated. In the power supply unit 203, a pull-up power node PU_ND supplies a pull-up voltage. A pull-down power node PD_ND is coupled to the pull-down power supply node PDSPL_ND regardless of the 1st and the 2nd reset signals RESET and SET, and supplies a pull-down voltage. A 1st switch P1 couples the pull-up power node PU_ND and the pull-up power supply node PUSPL_ND when both the 1st and 2nd reset signals RESET and SET are deactivated. A 3rd switch N2 couples the pull-up and the pull-down power supply nodes PUSPL_ND and PDSPL_ND when the 1st reset signal RESET or the 2nd reset signal SET is activated.

Figure 12:
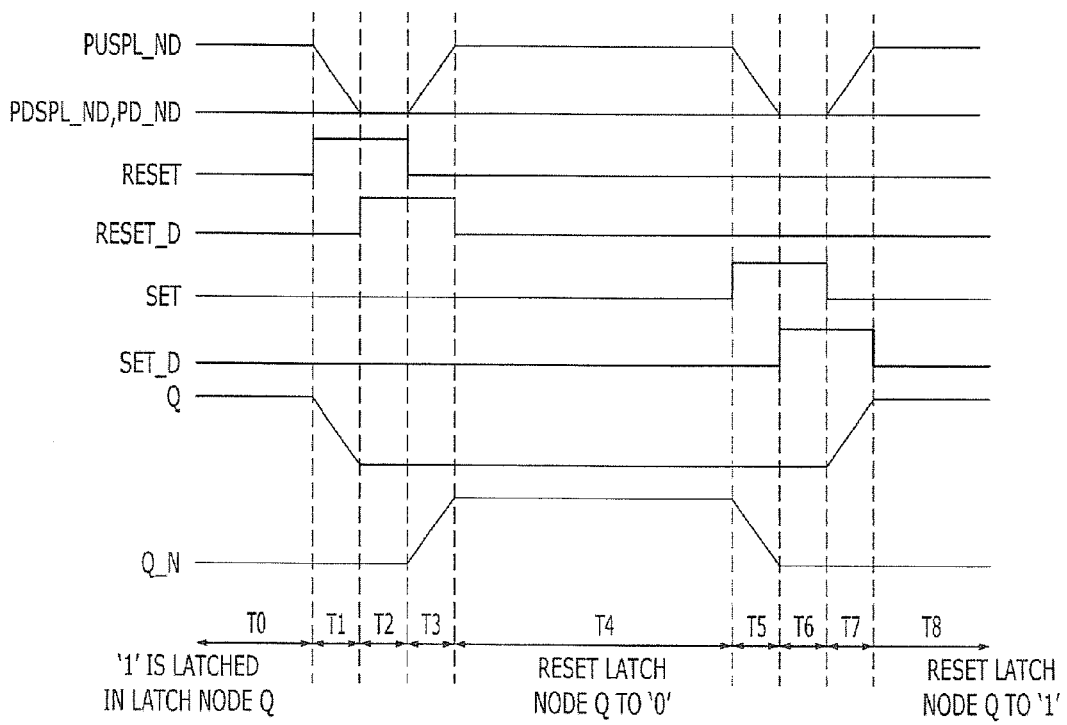
FIG. 12 is a timing diagram illustrating the reset operation of the latch circuit shown in FIG. 11.

FIG. 12 is a timing diagram showing the reset operation of the latch circuit shown in FIG. 11.

Operation of Resetting the Latch 103_1 to a Low Level in Response to a 1st Delayed Reset Signal RESET_D (Periods T0~T4)

The operation of resetting the latch 103_1 to a low level in response to the 1st delayed reset signal RESET_D is same as the reset operation of the latch 102_1 described with reference to FIG. 9. Data of a high level may be latched in the 1st latch node Q prior to the reset operation of the latch circuit. During a period T0, the 1st switch P1 is turned on and the 3rd switch N2 is turned off because both the 1st and 2nd reset signals RESET and SET are in a low level. Accordingly, the pull-up and pull-down power supply nodes PUSPL_ND and PDSPL_ND are not coupled to each other, and the pull-up power node PU_ND and the pull-up power supply node PUSPL_ND are coupled to each other, so the voltage VCC is supplied to the pull-up power supply node PUSPL_ND. Since the pull-down power supply node PDSPL_ND is coupled to the pull-down power node PD_ND regardless of the 1st and the 2nd reset signals RESET and SET, the voltage VSS is supplied to the pull-down power supply node PDSPL_ND. As a result, the voltage of the pull-up power supply node PUSPL_ND becomes a level of the voltage VCC, and the voltage of the pull-down power supply node PDSPL_ND becomes a level of the voltage VSS. The voltage of the 1st latch node Q becomes a level of the voltage VCC by the voltage of the pull-up power supply node PUSPL_ND, and the voltage of the 2nd latch node Q_N becomes a level of the voltage VSS by the voltage of the pull-down power supply node PDSPL_ND.

In a period T1, the 1st reset signal RESET is activated. Since the 1st switch P1 is turned off in response to the activated 1st reset signal RESET and thus the coupling of the pull-up power node PU_ND and the pull-up power supply node PUSPL_ND is no longer maintained, the voltage VCC is no longer supplied to the pull-up power supply node PUSPL_ND. Since the pull-down power supply node PDSPL_ND is coupled to the pull-down power node PD_ND regardless of the 1st and the 2nd reset signals RESET and SET, the voltage VSS is supplied to the pull-down power supply node PDSPL_ND. As a result, the voltage of the pull-down power supply node PDSPL_ND maintains the level of the voltage VSS. Since the 3rd switch N2 is turned on in response to the activated 1st reset signal RESET and thus the pull-up and pull-down power supply nodes PUSPL_ND and PDSPL_ND are coupled to each other, the voltage of the pull-up power supply node PUSPL_ND drops to a level of the voltage VSS. As a result, the voltage of the 1st latch node Q drops to the level of the voltage VSS by the voltage of the pull-up power supply node PUSPL_ND and the voltage of the 2nd latch node Q_N maintains the level of the voltage VSS by the voltage of the pull-down power supply node PDSPL_ND.

The delay unit 301 generates the 1st delayed reset signal RESET_D, whose activation period is overlapped with the activation period of the 1st reset signal RESET for a period T2, by delaying the 1st reset signal RESET. The 1st transistor 421_1 is turned on in response to the 1st reset signal RESET_D in the period T2, and thus the 1st latch node Q is grounded (VSS). The voltage of each of the 1st latch node Q and the 2nd latch node Q_N maintains the level of the pull-up power supply node PUSPL_ND or the pull-down power supply node PDSPL_ND that is, the level of the voltage VSS.

In a period T3, the 1st reset signal RESET is deactivated. Since both the 1st and 2nd reset signals RESET and SET are in a low level, the 3rd switch N2 is turned off and thus the coupling of the pull-up and pull-down power supply nodes PUSPL_ND and PDSPL_ND is no longer maintained. Since the 1st switch P1 is turned on and thus the pull-up power node PU_ND and the pull-up power supply node PUSPL_ND are coupled to each other, the voltage VCC is supplied to the pull-up power supply node PUSPL_ND. As a result, the voltage of the pull-up power supply node PUSPL_ND rises to a level of the voltage VCC. Since the pull-down power supply node PDSPL_ND is coupled to the pull-down power node PD_ND regardless of the 1st and the 2nd reset signals RESET and SET, the voltage of the pull-down power supply node PDSPL_ND maintains the level of the voltage VSS. The 1st latch node Q is grounded (VSS) by the 1st transistor 421_1 turned on in response to the 1st delayed reset signal RESET_D. As a result, the voltage of the 1st latch node Q maintains the level of the voltage VSS by the voltage of the pull-down power supply node PDSPL_ND, and the voltage of the 2nd latch node Q_N rises to a level of the voltage VCC by the voltage of the pull-up power supply node PUSPL_ND.

In a period T4, since the 1st delayed reset signal RESET_D is deactivated, the 1st transistor 421_1 is turned off, thereby breaking the coupling the 1st latch node Q and the ground node. As a result, in the period T4, the voltage of the 1st latch node Q maintains the level of the voltage VSS by the voltage of the pull-down power supply node PDSPL_ND, and the voltage of the 2nd latch node Q_N maintains the level of the voltage VCC by the voltage of the pull-up power supply node PUSPL_ND.

Operation of Resetting the Latch 103_1 to a High Level in Response to the 2nd Delayed Reset Signal SET_D (Period T5~T8)

As described above, in the period T4, data of a low level is latched in the 1st latch node Q In a period T5, the 2nd reset signal SET is activated. The 1st switch P1 is turned off in response to the activated 2nd reset signal SET and thus the coupling of the pull-up power node PU_ND and the pull-up power supply node PUSPL_ND is no longer maintained, so the voltage VCC is no longer supplied to the pull-up power supply node PUSPL_ND. Since the pull-down power supply node PDSPL_ND is coupled to the pull-down power node PD_ND regardless of the 1st and the 2nd reset signals RESET and SET, the voltage VSS is supplied to the pull-down power supply node PDSPL_ND. Accordingly, the voltage of the pull-down power supply node PDSPL_ND maintains the level of the voltage VSS. The 3rd switch N2 is turned on in response to the activated 2nd reset signal SET and thus the pull-up and pull-down power supply nodes PUSPL_ND and PDSPL_ND are coupled to each other, so the voltage of the pull-up power supply node PUSPL_ND drops to a level of the voltage VSS. As a result, the voltage of the 1st latch node Q maintains the level of the voltage VSS by the voltage of the pull-down power supply node PDSPL_ND, and the voltage of the 2nd latch node Q_N drops to a level of the voltage VSS by the voltage of the pull-up power supply node PUSPL_ND.

The delay unit 301 generates a 2nd delayed reset signal SET_D, whose activation period is overlapped with the activation period of the 2nd reset signal SET during a period T6, by delaying the 2nd reset signal SET. The 2nd latch node Q_N is grounded because the 2nd transistor 422_1 is turned on in response to the 2nd reset signal SET_D activated and delayed in the period T6. The voltage of each of the 1st latch node Q and the 2nd latch node Q_N maintains the level of the pull-up power supply node PUSPL_ND or the pull-down power supply node PDSPL_ND, that is, the level of the voltage VSS.

In a period T7, the 2nd reset signal SET is deactivated. Since both the 1st and 2nd reset signals RESET and SET are in a low level, the 3rd switch N2 is turned off and thus the coupling of the pull-up and pull-down power supply nodes PUSPL_ND and PDSPL_ND is no longer maintained. Since the 1st switch P1 is turned on and thus the pull-up power node PU_ND and the pull-up power supply node PUSPL_ND are coupled to each other, the voltage VCC is supplied to the pull-up power supply node PUSPL_ND. As a result, the voltage of the pull-up power supply node PUSPL_ND rises to a level of the voltage VCC. Since the pull-down power supply node PDSPL_ND is coupled to the pull-down power node PD_ND regardless of the 1st and the 2nd reset signals RESET and SET, the voltage of the pull-down power supply node PDSPL_ND maintains the level of the voltage VSS. The 2nd latch node Q_N is being grounded (VSS) by the 2nd transistor 422_1 turned on in response to the 2nd delayed reset signal SET_D. As a result, the voltage of the 2nd latch node Q_N maintains the level of the voltage VSS by the voltage of the pull-down power supply node PDSPL_ND and the voltage of the 1st latch node Q rises to a level of the voltage VCC by the voltage of the pull-up power supply node PUSPL_ND.

In a period T8, the 2nd delayed reset signal SET_D is deactivated and thus the 2nd transistor 422_1 is turned off, thereby breaking the coupling of the 2nd latch node Q_N and the ground node. As a result, in the period T8, the voltage of the 2nd latch node Q_N maintains the level of the voltage VSS by the voltage of the pull-down power supply node PDSPL_ND, and the voltage of the 1st latch node Q maintains the level of the voltage VCC by the voltage of the pull-up power supply node PUSPL_ND.

Figure 13:
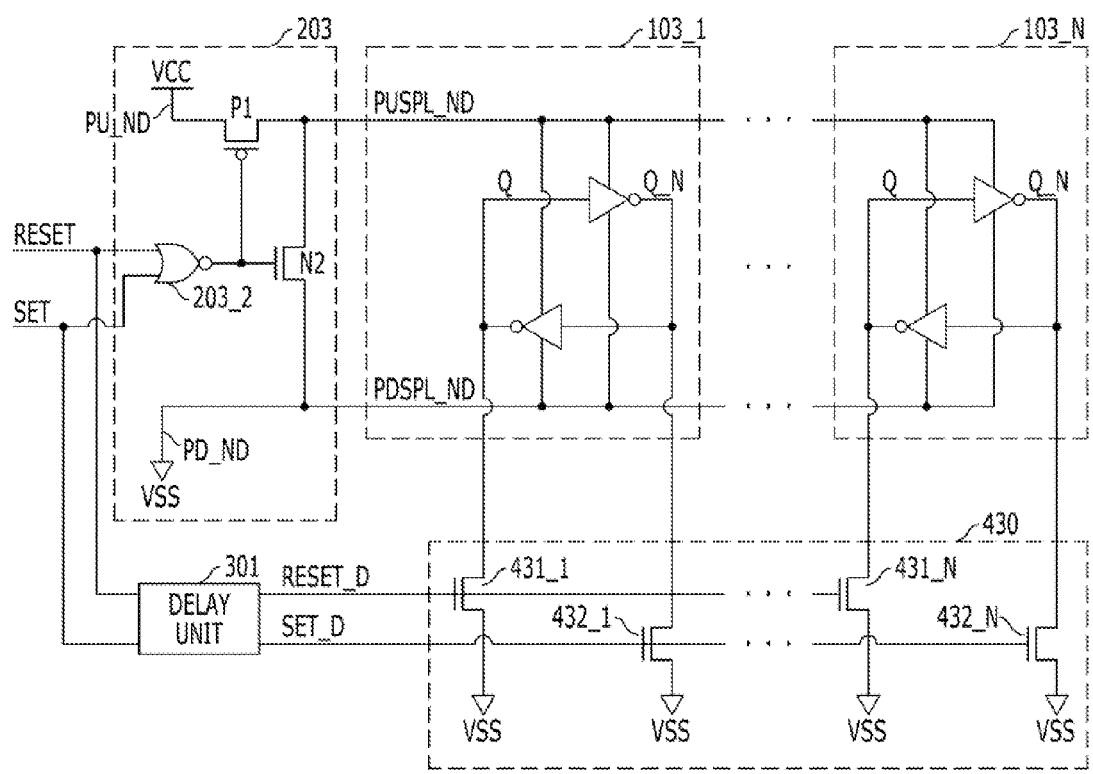
FIG. 13 is a diagram illustrating a latch circuit in accordance with an 8th embodiment of the present invention.

FIG. 13 is a diagram showing a latch circuit n accordance with an 8th embodiment of the present invention.

The latch circuit of FIG. 13 differs from the latch circuit of FIG. 11 in that it includes a plurality of latches 103_1~103_N. That is the latch circuit of FIG. 13 may include the latches 103_1~103_N, a power supply unit 203, a delay unit 301, and a reset unit 430.

The power supply unit 203 and the delay unit 301 have constructions and operating principles same as those of the power supply unit 203 and the delay unit 301, respectively, described with reference to FIG. 11.

Each of the latches 103_1~103_N latches data in response to power supplied to the pull-up and pull-down power supply nodes PUSPL_ND and PDSPL_ND. Each of the latches 103_1~103_N has a construction and operating principle same as that of the latch 103_1 described with reference to FIG. 11.

The reset unit 430 resets the plurality of latches 103_1~103_N to a 1st level in response to a 1st delayed reset signal RESET_D and resets the plurality of latches 103_1~103_N to a 2nd level in response to a 2nd delayed reset signal SET_D. FIG. 13 illustrates an example in which the reset unit 430 resets the latches 103_1~103_N to a low level when the 1st delayed reset signal RESET_D is activated, and resets the latches 103_1~103_N to a high level when the 2nd delayed reset signal SET_D is activated. The reset unit 430 include 1st transistors 431_1~431_N corresponding to the latches 103_1~103_N, respectively, and 2nd transistors 432_1~432_N corresponding to the latches 103_1~103_N, respectively. Each of the 1st transistors 431_1~431_N is turned on when the 1st delayed reset signal RESET_D is activated, and is coupled to the ground and the 1st latch node Q of a corresponding one of the latches 103_1~103_N. Each of the 2nd transistors 432_1~432_N is turned on when the 2nd delayed reset signal SET_D is activated, and is coupled to the ground and the 2nd latch node Q_N of a corresponding one of the latches 103_1~103_N.

The reset operation of the latch circuit of FIG. 13 is same as the reset operation of the latch circuit of FIG. 11 except that all the latches 103_1~103_N are reset at once.

Figure 14:
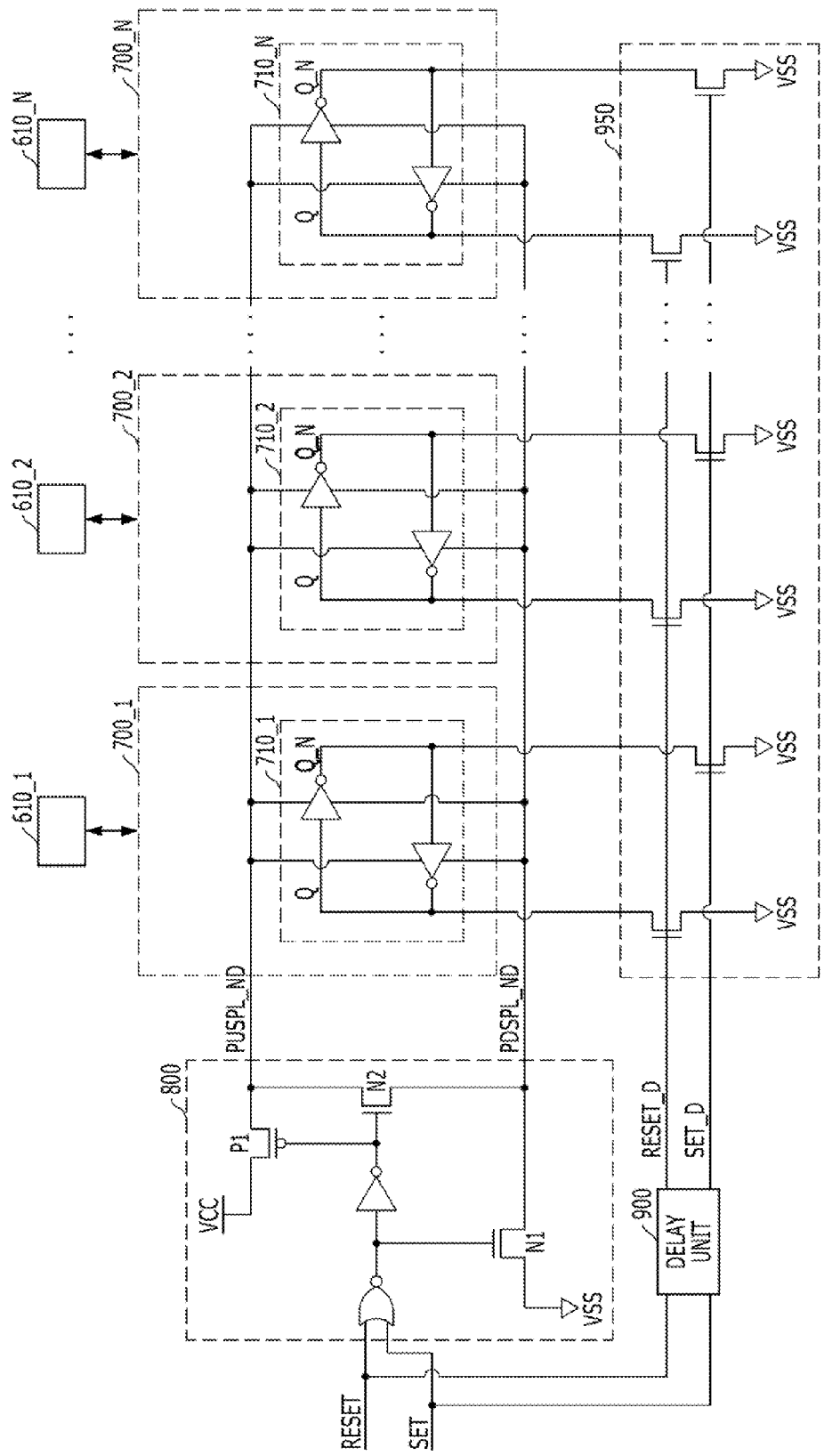
FIG. 14 is a diagram illustrating a nonvolatile memory device in accordance with an embodiment of the present invention.

FIG. 14 is a diagram showing a nonvolatile memory device in accordance with an embodiment of the present invention.

The nonvolatile memory device of FIG. 14 may include memory cells 610_1~610_N, page buffers 700_1~700_N a power supply unit 800, a delay unit 900, and a reset unit 950.

The page buffers 700_1~700_N access data stored in the memory cells 610_1~610_N, respectively. The page buffers 700_1~700_N perform a program operation for storing data in the memory cells 610_1~610_N and a read operation for reading data from the memory cells 610_1~610_N. Each of the page buffers 700_1~700_N includes one or more latches 710_1~710_N that operate in response to power supplied to the pull-up and pull-down power supply nodes PUSPL_ND and PDSPL_ND.

The power supply unit 800 supplies the same power (for example, voltage of a level between a pull-up voltage and a pull-down voltage) to the pull-up and pull-down power supply nodes PUSPL_ND and PDSPL_ND when a 1st reset signal RESET or a 2nd reset signal SET is activated. The power supply unit 800 has a construction and operating principle same as that of the power supply unit 202 described with reference to FIG. 10.

The delay unit 900 generates a 1st and 2nd delayed reset signals RESET_D and SET_D by delaying the 1st and 2nd reset signals RESET and SET. The delay unit 900 has a construction and operating principle same as that of the delay unit 900 described with reference to FIG. 10.

The reset unit 950 resets the latches 710_1~710_N to a 1st level in response to the 1st delayed reset signal RESET_D and resets the latches 710_1~710_N to a 2nd level in response to the 2nd delayed reset signal SET_D. FIG. 14 illustrates an example in which the reset unit 950 resets the latches 710_1~710_N to a low level when the 1st delayed reset signal RESET_D is activated, and resets the latches 710_1~710_N to a high level in response to the 2nd delayed reset signal SET_D. The reset unit 950 has a construction and operating principle same as that of the reset unit 430 described with reference to FIG. 10.

The nonvolatile memory device may have to reset the latches 710_1~710_N to the 1st or 2nd level at once during a program operation or a read operation. An operation of resetting the latches 710_1~710_N at once is same as the reset operation of the latch circuit described with reference to FIG. 10. The latches 710_1~710_N are precharged with voltage having a level between the 1st and 2nd levels (for example, voltage of a middle level), and then reset to the 1st level. That is, the voltages of the latches 710_1~710_N are reset step by step from a level between the 1st and 2nd level to the 1st level. Accordingly, in accordance with an embodiment of the present invention, a peak current may be lowered as compared with a conventional nonvolatile memory device configured to reset a plurality of latches at once from the 2nd level to the 1st level. Thus, a power drop occurring due to an excessive peak current may be prevented.

FIG. 14 illustrates an example in which the latches 710_1~710_N are reset in response to the two reset signals RESET and SET. In some embodiments, the nonvolatile memory device of the present invention may be designed to reset the latches 710_1~710_N in response to one reset signal RESET. In this case, the nonvolatile memory device may be designed without the 2nd reset signal SET and the 2nd delayed reset signal SET_D shown in FIG. 14.

The latch circuit in accordance with the present invention may be applied to nonvolatile memory devices besides various types of IC chips.

In accordance with the embodiments of the present invention, a plurality of latches may be reset with a minimum current and a minimum reset time. Accordingly, a power drop occurring due to an excessive peak current may be prevented.

While the present invention has been described with respect to the specific embodiments, it will be apparent to those skilled in the art that various changes and modifications may be made without departing from the spirit and scope of the invention as defined in the following claims.

What is claimed is:

1. A latch circuit, comprising:
a plurality of latches configured to operate in response to power supplied to a pull-up power supply node and a pull-down power supply node;
a delay unit configured to generate a delayed reset signal by delaying a reset signal;
a power supply unit configured to supply a pull-up voltage to the pull-up power supply node and a pull-down voltage to the pull-down power supply node when the reset signal is deactivated, and supply an identical voltage to the pull-up power supply node and the pull-down power supply node when the reset signal is activated; and
a reset unit configured to reset the plurality of latches to a reset level when the delayed reset signal is activated,
wherein an activation period of the reset signal and an activation period of the delayed reset signal at least partially overlap each other, and the pull-up power supply node and the pull-down power supply node have a level of the identical voltage when the delayed reset signal is activated.

2. A nonvolatile memory device, comprising:
a plurality of memory cells;
a plurality of page buffers configured to access data stored in the respective memory cells and each comprising one or more latches operating in response to power supplied to a pull-up power supply node and a pull-down power supply node;
a delay unit configured to generate a delayed reset signal by delaying a reset signal;
a power supply unit configured to supply a pull-up voltage to the pull-up power supply node and a pull-down voltage to the pull-down power supply node when the reset signal is deactivated, and supply an identical voltage to the pull-up power supply node and the pull-down power supply node when the reset signal is activated; and
a reset unit configured to reset the plurality of latches to a reset level when the delayed reset signal is activated,
wherein an activation period of the reset signal and an activation period of the delayed reset signal at least partially overlap each other, and the pull-up power supply node and the pull-down power supply node have a level of the identical voltage when the delayed reset signal is activated.

3. The latch circuit of claim 1, wherein the identical voltage includes the middle level between the pull pull-up voltage and the pull-down voltage,
wherein the power supply unit couples a pull-up power node to the pull-up power supply node, couples a pull-down power node to the pull-down power supply node, and doesn't couple the pull-up power supply node and the pull-down power supply node when the reset signal is deactivated,
wherein the power supply unit doesn't couple the pull-up power node and the pull-up power supply node, doesn't couple the pull-down power node and the pull-up power supply node, and couples the pull-up power supply node and the pull-down power supply node when the reset signal is deactivated,
wherein the reset unit supplies the pull-down voltage to a 1st latch node of each of the latches when the delayed reset signal is activated.

4. The latch circuit of claim 3, wherein the power supply unit comprises:
- a 1st switch configured to couple the pull-up power node and the pull-up power supply node when the reset signal is deactivated reset signal;
- a 2nd switch configured to couple the pull-down power node and the pull-down power supply node when the reset signal is deactivated reset signal; and
- a 3rd switch configured couple the pull-up and the pull-down power supply nodes when the reset signal is activated, and wherein the reset unit comprises:
- a 4th switch configured to supply the pull-down voltage to the 1st latch node when the delayed reset signal is activated.

5. The latch circuit of claim 1, wherein the identical voltage includes the pull-down voltage,
- wherein the power supply unit supplies the pull-down voltage to the pull-down power supply node,
- wherein the power supply unit couples a pull-up power node to the pull-up power supply node and doesn't couple the pull-up power supply node and the pull-down power supply node when the reset signal is deactivated,
- wherein the power supply unit doesn't couple the pull-up power node and the pull-up power supply node and couples the pull-up power supply node and the pull-down power supply node when the reset signal is deactivated,
- wherein the reset unit supplies the pull-down voltage to a 1st latch node of each of the latches when the delayed reset signal is activated.

6. The latch circuit of claim 5, wherein the power supply unit comprises:
- a 1st switch configured to couple the pull-up power node and the pull-up power supply node when the reset signal is deactivated reset signal; and
- a 2nd switch configured couple the pull-up and the pull-down power supply nodes when the reset signal is activated, and wherein the reset unit comprises:
- a 3rd switch configured to supply the pull-down voltage to the 1st latch node when the delayed reset signal is activated.

7. The nonvolatile memory device of claim 2, wherein the identical voltage includes the middle level between the pull pull-up voltage and the pull-down voltage,
- wherein the power supply unit couples a pull-up power node to the pull-up power supply node, couples a pull-down power node to the pull-down power supply node, and doesn't couple the pull-up power supply node and the pull-down power supply node when the reset signal is deactivated,
- wherein the power supply unit doesn't couple the pull-up power node and the pull-up power supply node, doesn't couple the pull-down power node and the pull-up power supply node, and couples the pull-up power supply node and the pull-down power supply node when the reset signal is deactivated,
- wherein the reset unit supplies the pull-down voltage to a 1st latch node of each of the latches when the delayed reset signal is activated.

8. The nonvolatile memory device of claim 7, wherein the power supply unit comprises:
- a 1st switch configured to couple the pull-up power node and the pull-up power supply node when the reset signal is deactivated reset signal;
- a 2nd switch configured to couple the pull-down power node and the pull-down power supply node when the reset signal is deactivated reset signal; and
- a 3rd switch configured couple the pull-up and the pull-down power supply nodes when the reset signal is activated, and wherein the reset unit comprises:
- a 4th switch configured to supply the pull-down voltage to the 1st latch node when the delayed reset signal is activated.

9. The nonvolatile memory device of claim 2, wherein the identical voltage includes the pull-down voltage,
- wherein the power supply unit supplies the pull-down voltage to the pull-down power supply node,
- wherein the power supply unit couples a pull-up power node to the pull-up power supply node and doesn't couple the pull-up power supply node and the pull-down power supply node when the reset signal is deactivated,
- wherein the power supply unit doesn't couple the pull-up power node and the pull-up power supply node and couples the pull-up power supply node and the pull-down power supply node when the reset signal is deactivated,
- wherein the reset unit supplies the pull-down voltage to a 1st latch node of each of the latches when the delayed reset signal is activated.

10. The nonvolatile memory device of claim 9, wherein the power supply unit comprises:
- a 1st switch configured to couple the pull-up power node and the pull-up power supply node when the reset signal is deactivated reset signal; and
- a 2nd switch configured couple the pull-up and the pull-down power supply nodes when the reset signal is activated, and wherein the reset unit comprises:
- a 3rd switch configured to supply the pull-down voltage to the 1st latch node when the delayed reset signal is activated.

11. A latch circuit, comprising:
- a plurality of latches configured to operate in response to power supplied to a pull-up power supply node and a pull-down power supply node;
- a delay unit configured to generate a 1st delayed reset signal by delaying a 1st reset signal and generate a 2nd delayed reset signal by delaying a 2nd reset signal;
- a power supply unit configured to supply a pull-up voltage to the pull-up power supply node and a pull-down voltage to the pull-down power supply node when the reset signal is deactivated, and supply an identical voltage to the pull-up power supply node and the pull-down power supply node when the reset signal is activated; and
- a reset unit configured to reset the plurality of latches to a 1st reset level when the 1st delayed reset signal is activated and reset the plurality of latches to a $2^{nd}$ reset level when the 2st delayed reset signal is activated, wherein an activation period of the reset signal and an activation period of the delayed reset signal at least partially overlap each other.

12. The latch circuit of claim 11, wherein the identical voltage includes the middle level between the pull pull-up voltage and the pull-down voltage,
- wherein the power supply unit couples a pull-up power node to the pull-up power supply node, couples a pull-down power node to the pull-down power supply node, and doesn't couple the pull-up power supply node and the pull-down power supply node when the reset signal is deactivated, wherein the power supply unit doesn't couple the pull-up power node and the pull-up power supply node, doesn't couple the pull-down power node and the pull-up power supply node, and couples the pull-up power supply node and the pull-down power supply node when the reset signal is deactivated, wherein the reset unit supplies the pull-down voltage to a 1st latch node of each of the latches when the 1st delayed reset signal is activated, and supplies the pull-down voltage to a 2nd latch node of each of the latches when the 2nd delayed reset signal is activated.

13. The latch circuit of claim 12, wherein the power supply unit comprises:
   a 1st switch configured to couple the pull-up power node and the pull-up power supply node when the reset signal is deactivated reset signal;
   a 2nd switch configured to couple the pull-down power node and the pull-down power supply node when the reset signal is deactivated reset signal; and
   a 3rd switch configured couple the pull-up and the pull-down power supply nodes when the reset signal is activated, and
   wherein the reset unit comprises:
   a 4th switch configured to supply the pull-down voltage to the 1st latch node when the 1st delayed reset signal is activated; and
   a 5th switch configured to supply the pull-down voltage to the 2nd latch node when the 2nd delayed reset signal is activated.

14. The latch circuit of claim 11, wherein the identical voltage includes the pull-down voltage,
   wherein the power supply unit supplies the pull-down voltage to the pull-down power supply node,
   wherein the power supply unit couples a pull-up power node to the pull-up power supply node and doesn't couple the pull-up power supply node and the pull-down power supply node when the reset signal is deactivated,
   wherein the power supply unit doesn't couple the pull-up power node and the pull-up power supply node and couples the pull-up power supply node and the pull-down power supply node when the reset signal is deactivated,
   wherein the reset unit supplies the pull-down voltage to a 1st latch node of each of the latches when the 1st delayed reset signal is activated, and supplies the pull-down voltage to a 2nd latch node of each of the latches when the 2nd delayed reset signal is activated.

15. The latch circuit of claim 14, wherein the power supply unit comprises:
   a 1st switch configured to couple the pull-up power node and the pull-up power supply node when the reset signal is deactivated reset signal; and
   a 2nd switch configured couple the pull-up and the pull-down power supply nodes when the reset signal is activated, and
   wherein the reset unit comprises:
   a 3rd switch configured to supply the pull-down voltage to the 1st latch node when the 1st delayed reset signal is activated; and
   a 4th switch configured to supply the pull-down voltage to the 2nd latch node when the 2nd delayed reset signal is activated.

16. A nonvolatile memory device, comprising:
   a plurality of memory cells;
   a plurality of page buffers configured to access data stored in the respective memory cells and each comprising one or more latches operating in response to power supplied to a pull-up power supply node and a pull-down power supply node;
   a delay unit configured to generate a 1st delayed reset signal by delaying a 1st reset signal and generate a 2nd delayed reset signal by delaying a 2nd reset signal;
   a power supply unit configured to supply a pull-up voltage to the pull-up power supply node and a pull-down voltage to the pull-down power supply node when the reset signal is deactivated, and supply an identical voltage to the pull-up power supply node and the pull-down power supply node when the reset signal is activated; and
   a reset unit configured to reset the plurality of latches to a 1st reset level when the 1st delayed reset signal is activated and reset the plurality of latches to a $2^{nd}$ reset level when the $2^{nd}$ delayed reset signal is activated,
   wherein an activation period of the reset signal and an activation period of the delayed reset signal at least partially overlap each other.

17. The nonvolatile memory device of claim 16, wherein the identical voltage includes the middle level between the pull pull-up voltage and the pull-down voltage,
   wherein the power supply unit couples a pull-up power node to the pull-up power supply node, couples a pull-down power node to the pull-down power supply node, and doesn't couple the pull-up power supply node and the pull-down power supply node when the reset signal is deactivated,
   wherein the power supply unit doesn't couple the pull-up power node and the pull-up power supply node, doesn't couple the pull-down power node and the pull-up power supply node, and couples the pull-up power supply node and the pull-down power supply node when the reset signal is deactivated,
   wherein the reset unit supplies the pull-down voltage to a 1st latch node of each of the latches when the 1st delayed reset signal is activated, and supplies the pull-down voltage to a 2nd latch node of each of the latches when the 2nd delayed reset signal is activated.

18. The nonvolatile memory device of claim 17, wherein the power supply unit comprises:
   a 1st switch configured to couple the pull-up power node and the pull-up power supply node when the reset signal is deactivated reset signal;
   a 2nd switch configured to couple the pull-down power node and the pull-down power supply node when the reset signal is deactivated reset signal; and
   a 3rd switch configured couple the pull-up and the pull-down power supply nodes when the reset signal is activated, and
   wherein the reset unit comprises:
   a 4th switch configured to supply the pull-down voltage to the 1st latch node when the 1st delayed reset signal is activated; and
   a 5th switch configured to supply the pull-down voltage to the 2nd latch node when the 2nd delayed reset signal is activated.

19. The nonvolatile memory device of claim 16, wherein the identical voltage includes the pull-down voltage,
   wherein the power supply unit supplies the pull-down voltage to the pull-down power supply node,
   wherein the power supply unit couples a pull-up power node to the pull-up power supply node and doesn't couple the pull-up power supply node and the pull-down power supply node when the reset signal is deactivated,
   wherein the power supply unit doesn't couple the pull-up power node and the pull-up power supply node and couples the pull-up power supply node and the pull-down power supply node when the reset signal is deactivated, wherein the reset unit supplies the pull-down voltage to a 1st latch node of each of the latches when the 1st delayed reset signal is activated, and supplies the pull-down voltage to a 2nd latch node of each of the latches when the 2nd delayed reset signal is activated.

20. The nonvolatile memory device of claim 19, wherein the power supply unit comprises:
   a 1st switch configured to couple the pull-up power node and the pull-up power supply node when the reset signal is deactivated reset signal; and
   a 2nd switch configured couple the pull-up and the pull-down power supply nodes when the reset signal is activated, and wherein the reset unit comprise:

a 3rd switch configured to supply the pull-down voltage to the 1st latch node when the 1st delayed reset signal is activated; and a 4th switch configured to supply the pull-down voltage to the 2nd latch node when the 2nd delayed reset signal is activated.

* * * * *